US008069026B2

(12) United States Patent
Higuchi

(10) Patent No.: US 8,069,026 B2
(45) Date of Patent: Nov. 29, 2011

(54) CLOCK GATING ANALYZING APPARATUS, CLOCK GATING ANALYZING METHOD, AND COMPUTER PRODUCT

(75) Inventor: Hiroyuki Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 844 days.

(21) Appl. No.: 12/002,349

(22) Filed: Dec. 17, 2007

(65) Prior Publication Data

US 2008/0195367 A1    Aug. 14, 2008

(30) Foreign Application Priority Data

Feb. 13, 2007  (JP) ................................ 2007-032540

(51) Int. Cl.
*G06F 17/50* (2006.01)
(52) U.S. Cl. ................................ 703/15; 703/13; 703/14
(58) Field of Classification Search .................... 703/13, 703/14, 19
See application file for complete search history.

(56) References Cited

U.S. PATENT DOCUMENTS

| 6,035,112 | A | 3/2000 | Kito | |
|---|---|---|---|---|
| 6,202,166 | B1 * | 3/2001 | Tang | ............................. 713/500 |
| 6,557,150 | B1 | 4/2003 | Honmura | |
| 2006/0085713 | A1 | 4/2006 | Takabatake | |

FOREIGN PATENT DOCUMENTS

| JP | A 8-202569 | 8/1996 |
|---|---|---|
| JP | 09-251483 | 9/1997 |
| JP | A 10-283381 | 10/1998 |
| JP | A 11-259554 | 9/1999 |
| JP | 2006-106865 | 4/2006 |
| WO | WO 99/09497 | 2/1999 |

OTHER PUBLICATIONS

Higuchi et al. "A Fast State Reduction Alogrithm for Incompletely Specified Finite State Machines", 1996 ACM. 4 pages.*
Benini et al. "Automatic Synthesis of Low-Power Gated-Clock Finite-State Machine" IEEE 1996. p. 630-643.*
Benini et al. "Design for testablity of gated-clock FSMs", IEEE 1996. p. 589-596.*
Benini et al. "Symbolic Synthesis of clock-Gating Logic for Power Optimization of control-Oriented Synchronous Networks", IEEE1997., p. 514-520.*
Physics3330. "Digital Electronics I: Logic, Flip-Flops, and Clocks", http://www.colorado.edu/physics/phys3330/phys3330_fa05/manual/Exp_9.pdf. 2005.*
M. Kawarabayashi et al., "A Verification Technique for Gated Clock," Proceedings of the Design Automation Conference, pp. 123-127, 1993.

* cited by examiner

*Primary Examiner* — Paul Rodriguez
*Assistant Examiner* — Eunhee Kim
(74) *Attorney, Agent, or Firm* — Greer, Burns & Crain, Ltd.

(57) ABSTRACT

Clock gating analysis of a target circuit having a plurality of clock gates, involves the calculation of a clock gate function for each of the clock gates. The clock gate functions indicate an activation state of the clock gates and a combination of output values from sequential circuit elements in the target circuit are substituted into each of the clock gate functions to obtained clock gate function values. Combinations of the clock gate function values form individual clock gating states. Each clock gating state indicates an activation state of each of the local clocks, collectively. A table indicating correlations between the combinations of output values and the clock gating states is generated and from the conversion table, a group that includes all of the clock gating states possible is output.

24 Claims, 24 Drawing Sheets

| LC1 | LC2 | LC3 |
|---|---|---|
| NON-ACTIVE | ACTIVE | ACTIVE |
| ACTIVE | NON-ACTIVE | ACTIVE |
| ⋮ | ⋮ | ⋮ |

STATE TABLE T2

| x1 | y1y2y3 | z1z2z3 | f1f2f3 | g1g2g3 |
|---|---|---|---|---|
| 0 | 000 | 001 | 011 | 011 |
| 0 | 001 | 011 | 011 | 011 |
| 0 | 010 | 000 | 011 | 011 |
| 0 | 011 | 010 | 011 | 011 |
| 0 | 100 | 000 | 110 | 011 |
| 0 | 101 | 000 | 111 | 011 |
| 0 | 110 | 000 | 111 | 011 |
| 0 | 111 | 000 | 101 | 011 |
| 1 | 000 | 101 | 011 | 111 |
| 1 | 001 | 111 | 011 | 101 |
| 1 | 010 | 100 | 011 | 110 |
| 1 | 011 | 110 | 011 | 111 |
| 1 | 100 | 100 | 110 | 110 |
| 1 | 101 | 100 | 111 | 110 |
| 1 | 110 | 100 | 111 | 110 |
| 1 | 111 | 100 | 101 | 110 |

STATE TABLE T2

| x1 | y1y2y3 | z1z2z3 | f1f2f3 | g1g2g3 |
|---|---|---|---|---|
| 0 | 000 | 001 | 011 | 011 |
| 0 | 001 | 011 | 011 | 011 |
| 0 | 010 | 000 | 011 | 011 |
| 0 | 011 | 010 | 011 | 011 |
| 0 | 100 | 000 | 110 | 011 |
| 0 | 101 | 000 | 111 | 011 |
| 0 | 110 | 000 | 111 | 011 |
| 0 | 111 | 000 | 101 | 011 |
| 1 | 000 | 101 | 011 | 111 |
| 1 | 001 | 111 | 011 | 101 |
| 1 | 010 | 100 | 011 | 110 |
| 1 | 011 | 110 | 011 | 111 |
| 1 | 100 | 100 | 110 | 110 |
| 1 | 101 | 100 | 111 | 110 |
| 1 | 110 | 100 | 111 | 110 |
| 1 | 111 | 100 | 101 | 110 |

STATE TABLE T2

| x1 | y1y2y3 | z1z2z3 | f1f2f3 | g1g2g3 |
|---|---|---|---|---|
| 0 | 000 | 001 | 011 | 011 |
| 0 | 001 | 011 | 011 | 011 |
| 0 | 010 | 000 | 011 | 011 |
| 0 | 011 | 010 | 011 | 011 |
| 0 | 100 | 000 | 110 | 011 |
| 0 | 101 | 000 | 111 | 011 |
| 0 | 110 | 000 | 111 | 011 |
| 0 | 111 | 000 | 101 | 011 |
| 1 | 000 | 101 | 011 | 111 |
| 1 | 001 | 111 | 011 | 101 |
| 1 | 010 | 100 | 011 | 110 |
| 1 | 011 | 110 | 011 | 111 |
| 1 | 100 | 100 | 110 | 110 |
| 1 | 101 | 100 | 111 | 110 |
| 1 | 110 | 100 | 111 | 110 |
| 1 | 111 | 100 | 101 | 110 |

1303 → row 1 (0 000 001 011 011)
1302 → row 2 (0 001 011 011 011)
1301 → row (1 011 110 011 111)

T2 STATE TABLE

| x1 | y1y2y3 | z1z2z3 | f1f2f3 | g1g2g3 | |
|---|---|---|---|---|---|
| 0 | 000 | 001 | 011 | 011 | ←2203 |
| 0 | 001 | 011 | 011 | 011 | |
| 0 | 010 | 000 | 011 | 011 | |
| 0 | 011 | 010 | 011 | 011 | |
| 0 | 100 | 000 | 110 | 011 | |
| 0 | 101 | 000 | 111 | 011 | |
| 0 | 110 | 000 | 111 | 011 | |
| 0 | 111 | 000 | 101 | 011 | ←2201 |
| 1 | 000 | 101 | 011 | 111 | |
| 1 | 001 | 111 | 011 | 101 | ←2202 |
| 1 | 010 | 100 | 011 | 110 | |
| 1 | 011 | 110 | 011 | 111 | |
| 1 | 100 | 100 | 110 | 110 | |
| 1 | 101 | 100 | 111 | 110 | |
| 1 | 110 | 100 | 111 | 110 | |
| 1 | 111 | 100 | 101 | 110 | |

(1) CONVERT LC1 FROM 1 TO 0

(2) DELETE CONVERTED CG STATE INCLUDED IN UNCONVERTED CG GROUP (3) RESTORE CONVERTED CG STATE TO UNCONVERTED CG STATE

CLOCK GATING ANALYZING APPARATUS, CLOCK GATING ANALYZING METHOD, AND COMPUTER PRODUCT

CROSS-REFERENCE TO RELATED APPLICATIONS

This application is based upon and claims the benefit of priority from the prior Japanese Patent Application No. 2007-032540, filed on Feb. 13, 2007, the entire contents of which are incorporated herein by reference.

BACKGROUND OF THE INVENTION

1. Field of the Invention

The present invention relates to a technology for analyzing clock gating in large-scale integrated (LSI) semiconductor circuits.

2. Description of the Related Art

Clock gating (function) is a common technique for reducing power consumption of LSI circuits and involves terminating, as close as possible to the source, clock signals for an inactive portion of an LSI circuit to reduce power consumption resulting from the propagation of unnecessary clock signals. Conventionally, since clock gating was manually inserted in large blocks, designers could completely comprehend the operation of the clock gating function. Conventional clock gating verification includes timing verification of clock system signals, i.e., verifying whether the arrival timing of a control signal of individual clock gates falls within a range of normal operation, (see, for example, Japanese Patent Application Laid-Open Publication Nos. 8-202569 and 11-259554), and timing verification of data system signals with consideration of the clock gate function (see, for example, M. Kawarabayashi, et al., "A Verification Technique for Gated Clock", Proceedings of the Design Automation Conference, pp. 123-127, 1993).

With regard to clock gating verification other than by timing verification, tools have been disclosed to the extent of extracting and depicting a partial circuit related to the clock gating (see, for example, Japanese Patent Application Laid-Open Publication No. 10-283381).

However, demand for further reductions in the power consumption of LSI circuits has increased and clock gating has been inserted in smaller blocks or automatically. The number of inserted clock gates has increased considerably, and overall comprehension of the relationships between individual clock gates has become nearly impossible for designers.

Under such circumstances, verification oversights of the clock gate function itself has become problematic. Specifically, if a clock is not terminated at a point where the clock must be terminated or if a clock is terminated at a point where the clock must not be terminated, this emerges as a function bug and, therefore, poor design due to the verification oversight becomes a problem. If a clock is not terminated at a point where the clock should be terminated, even when no function bug emerges, it is problematic in that electric power is wastefully consumed. Recently, strict limitations are placed on power consumption and a slight increase in consumption often becomes problematic as the target electric power is exceeded.

SUMMARY OF THE INVENTION

It is an object of the present invention to at least solve the above problems in the conventional technologies.

A computer-readable recording medium according to one aspect of the present invention stores therein a clock gating analyzing program that causes a computer to execute detecting a plurality of clock gates that supply a clock or terminate the clock to a plurality of sequential circuit elements in a target circuit; calculating, for each of the clock gates, a clock gate function indicating activation of a local clock output from a local clock detected at the detecting; generating a conversion table by a substitution of a plurality of combinations of output values from the sequential circuit elements into each of the clock gate functions to calculate a plurality of combinations of clock gate function values, each combination of clock gate function values being a clock gating state that indicates an activation state of each of the local clocks collectively, wherein the conversion table indicates a conversion of the combination of output values to the clock gating state; and outputting a clock-gating-all-state group covering all the clock gating states possible in the target circuit based on the conversion table.

A clock gating analyzing according to another aspect of the present invention includes a detecting unit that detects a plurality of clock gates that supply a clock or terminate the clock to a plurality of sequential circuit elements in a target circuit; a clock-gate-function-calculating unit that calculates, for each of the clock gates, a clock gate function indicating activation of a local clock output from a local clock detected by the detecting unit; a conversion table generating unit that generates a conversion table by a substitution of a plurality of combinations of output values from the sequential circuit elements into each of the clock gate functions to calculate a plurality of combinations of clock gate function values, each combination of clock gate function values being a clock gating state that indicates an activation state of each of the local clocks collectively, wherein the conversion table indicates a conversion of the combination of output values to the clock gating state; and a clock-gating-all-state-group outputting unit that outputs a clock-gating-all-state group covering all the clock gating states possible in the target circuit based on the conversion table.

A clock gating analyzing method according to yet another aspect of the present invention includes detecting a plurality of clock gates that supply a clock or terminate the clock to a plurality of sequential circuit elements in a target circuit; calculating, for each of the clock gates, a clock gate function indicating activation of a local clock output from a local clock detected at the detecting; generating a conversion table by a substitution of a plurality of combinations of output values from the sequential circuit elements into each of the clock gate functions to calculate a plurality of combinations of clock gate function values, each combination of clock gate function values being a clock gating state that indicates an activation state of each of the local clocks collectively, wherein the conversion table indicates a conversion of the combination of output values to the clock gating state; and outputting a clock-gating-all-state group covering all the clock gating states possible in the target circuit based on the conversion table.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Referring to the accompanying drawings, exemplary embodiments according to the present invention are explained in detail below.

Figure 1:
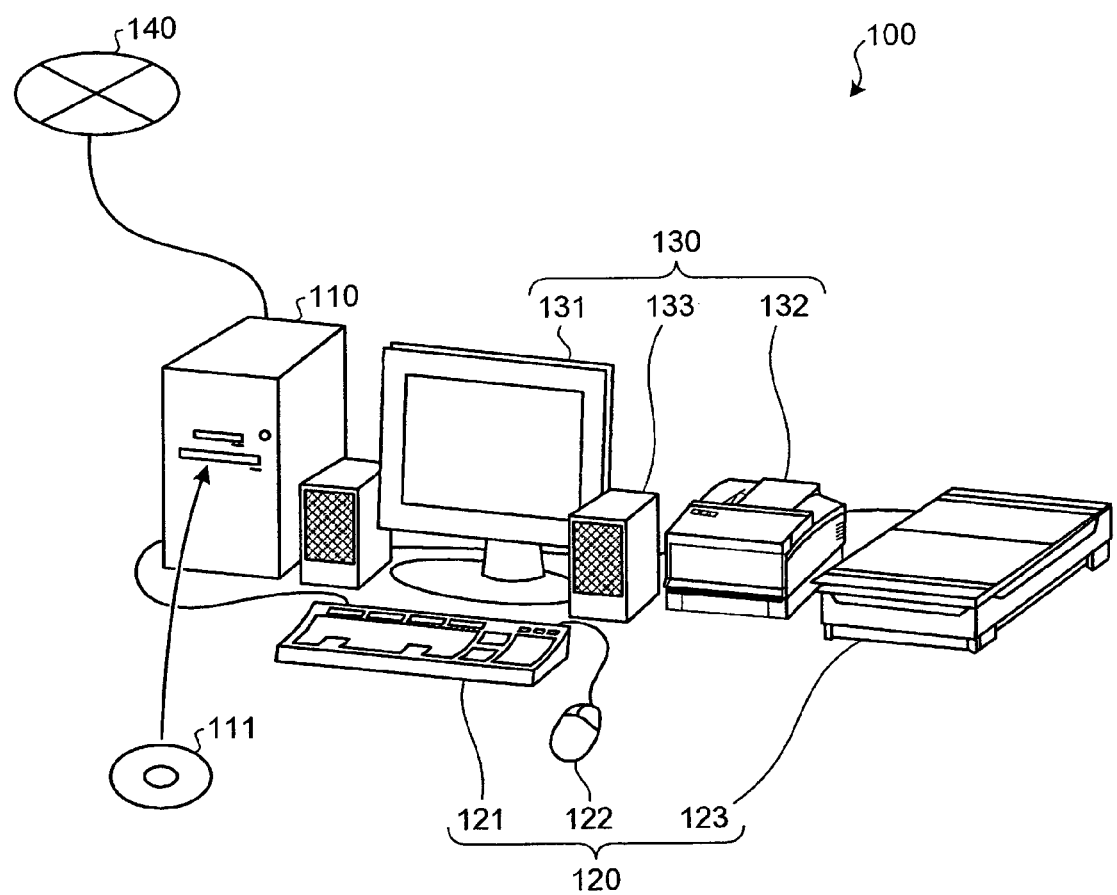
FIG. 1 is a block diagram of a clock gating analyzing apparatus according to an embodiment of the present invention.

FIG. 1 is a block diagram of a clock gating analyzing apparatus according to the embodiment of the present invention. A clock gating analyzing apparatus 100 includes a computer main body 110, input devices 120, and output devices 130, and can be connected to a network 140 such as a local area network (LAN), a wide area network (WAN) and the internet through a router or modem not shown.

The computer main body 110 includes a CPU, a memory, and an interface. The CPU is responsible for overall control of the clock gating analyzing apparatus 100. The memory includes read-only memory (ROM), a random access memory (RAM), a hard disk (HD), and a flash memory. The memory is used as a work area of the CPU.

The memory has various programs stored thereon, which are loaded in accordance with instructions from the CPU. On the HD and the optical disc 111, data read/write is controlled by disc drives. The optical disc 111 and the flash memory are removable from the computer main body 110. The interface controls input from the input devices 120, output to the output devices 130, and transmission/reception to/from the network 140.

The input devices 120 include, for example, a keyboard 121, a mouse 122, and a scanner 123. The keyboard 121 includes keys for inputting characters, numerical characters, various instructions, etc., to input data. Alternatively, a touch panel may be used. The mouse 122 moves a cursor, selects an area, and/or moves and resizes a window. The scanner 123 optically reads an image. The read image is captured as image data and stored in the memory in the computer main body 110. The scanner 123 may have an optical character recognition (OCR) function.

The output devices 130 include a display 131, a printer 132, a speaker 133, etc. The display 131 displays a cursor, icons or tool boxes as well as data such as documents, images, and function information. The printer 132 prints image data and document data. The speaker 133 outputs sound such as sound effects and read-out sound.

Figure 2:
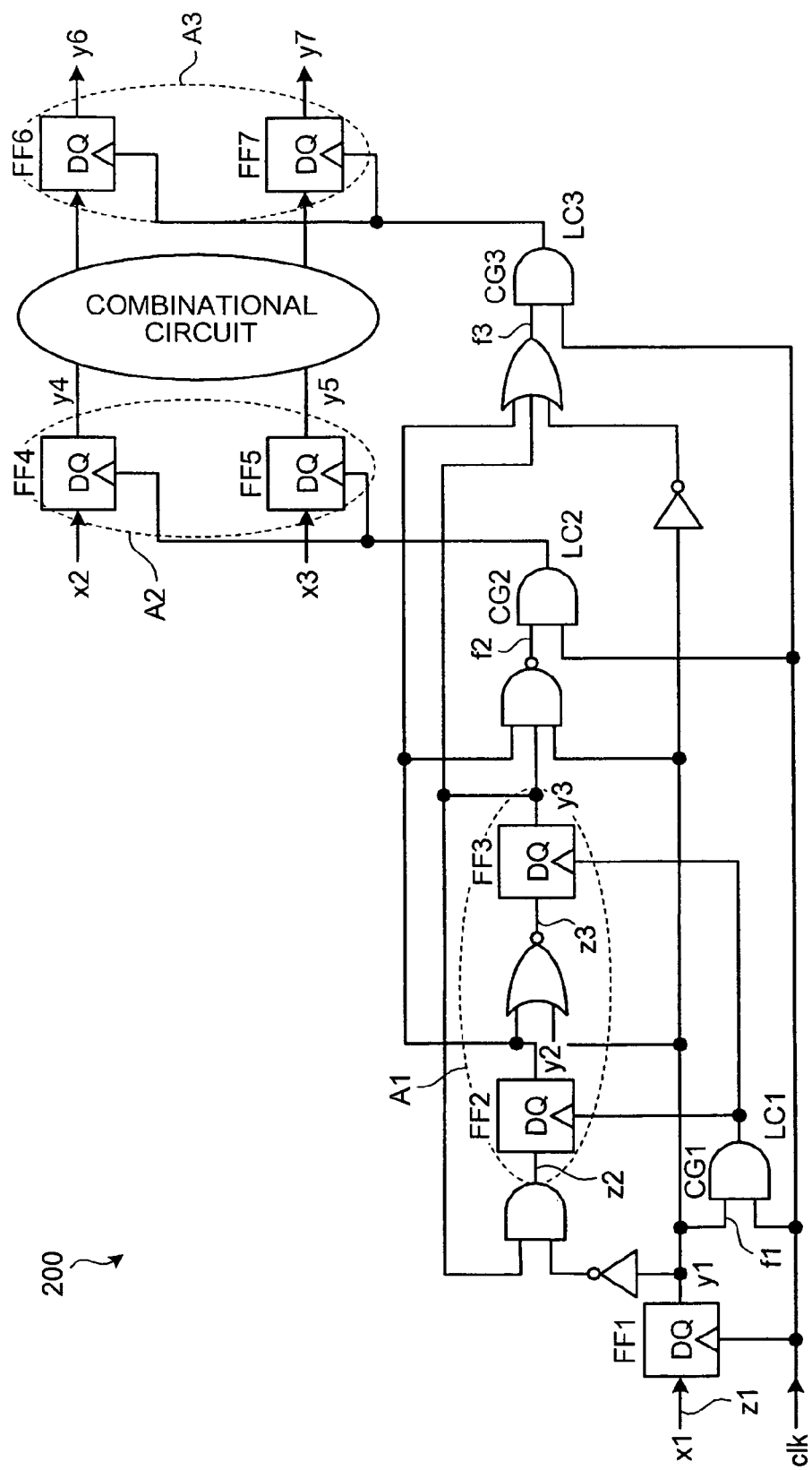
FIG. 2 is a circuit diagram of an example of a circuit to be analyzed by the clock gating analyzing apparatus.

FIG. 2 is a circuit diagram of an example of a circuit to be analyzed by the clock gating analyzing apparatus 100. A circuit 200, a subject of analysis is represented by design data such as a netlist after logic synthesis. The circuit 200 is provided with a clock gate CGi (i=1, 2, . . . ). The clock gate CGi is a circuit that controls output of the clock output to a sequential circuit element (e.g., a flip-flop circuit, hereinafter, "FF") and is configured by a logic gate such as an AND circuit.

More specifically, the output terminal of the clock gate CGi is connected to the clock terminal of the FF, and one input terminal receives a clock and the other input terminal receives a control signal to terminate the clock by the clock gating or to output the clock to the clock terminal of the sequential circuit element that is an output destination (whether direct or indirect). A clock clk output from the clock gate CGi to the destination sequential circuit element in this way is referred to as a local clock LCi.

The FFs receiving the same local clock LCi from the clock terminals are referred to as an "FF group Ai of the local clock LCi". For example, an FF group A1 of a local clock LC1 includes an FF 2 and an FF 3; an FF group A2 of a local clock LC2 includes an FF 4 and an FF 5; and an FF group A3 of a local clock LC3 includes an FF 6 and an FF 7.

Since an FF 1 receives no local clock LCi, the FF 1 does not belong to any FF group Ai. In FIG. 2, reference numerals x1 to x3 are input values to the FF 1, the FF 4, and the FF 5, respectively, and reference numerals y1 to y7 are output values from the FF 1 to FF 7, respectively.

Figures 3, 4:
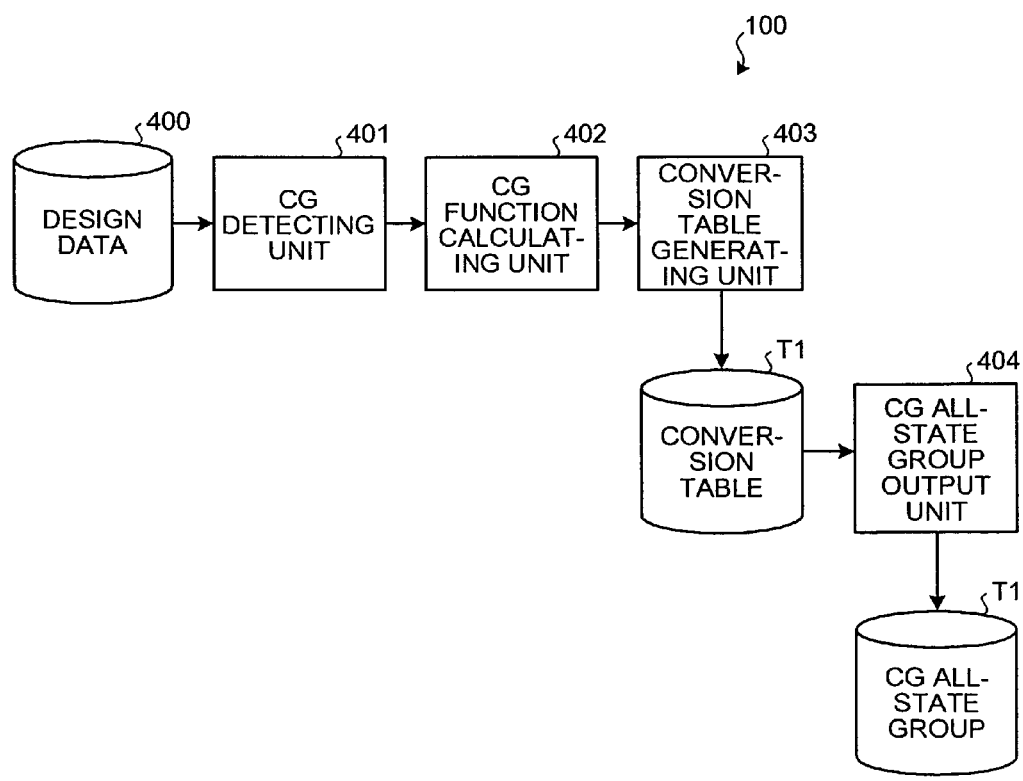
FIG. 3 is a schematic of a clock gating state of the circuit shown in FIG. 2.
FIG. 4 is a functional diagram of a first configuration of the clock gating analyzing apparatus.

FIG. 3 is a schematic of the clock gating state of the circuit 200 shown in FIG. 2. The clock gating state indicates a change in the state of a group of the clock gate CGi at the same time-point. The clock gating state collectively represents each state of the local clocks LCi in a group. The clock gating state includes active and inactive; in the active state, the local clock LCi is output to the FFs of the FF group Ai; and in the inactive state, the output of the local clock LCi is fixed to an inactive value (e.g., 0 in the case of a positive edge trigger FF and 1 in the case of a negative edge trigger FF).

FIG. 4 is a functional diagram of a first configuration of the clock gating analyzing apparatus 100. The clock gating analyzing apparatus 100 is configured to generate a group (hereinafter, a "CG all-state group") of the clock gating states (hereinafter, "CG states") of the circuit 200.

The clock gating analyzing apparatus 100 includes a clock gate detecting unit (CG detecting unit) 401, a clock gate function (hereinafter, "CG function") calculating unit 402, a conversion table generating unit 403, and a CG all-state group output unit 404. The functions of the units 401 to 404 can be realized by the execution (by a computer) of relevant programs stored in the memory.

The output data from the units 401 to 404 are stored in the memory. Functional constituent elements at the destinations of connection indicated by arrows shown in FIG. 4 read, from the memory, the output data from functional constituent elements at the sources of connections and the CPU executes the programs related to the functions.

First, the clock gate detecting unit 401 receives design data 400, such as a netlist related to the circuit 200, to detect the clock gate CGi present in the circuit 200 represented by the design data 400. Specifically, among cells present between the clock source and the FF, cells other than buffers and inverters (e.g., the above AND circuit) are detected as the clock gates.

The CG function calculating unit 402 calculates a CG function representing activation/inactivation of the local clock LCi output from the clock gate CGi detected by the CG detecting unit 401. The CG function is a function that represents a value of the control signal input to the other input terminal other than the input terminal of the clock clk in the clock gate CGi. The CG function of the clock gate CGi is hereinafter referred to as fi. The CG function fi indicates activation/inactivation of the local clock LCi (at the current time) of the clock gate CGi.

For example, since the clock gate CG1 receives the output y1 of the FF 1 as the control signal, the CG function f1 of the clock gate CG1 is expressed as $$f1 = y1 \qquad (1)$$

Since the clock gate CG2 receives the output from a NAND circuit as the control signal, the CG function f2 of the clock gate CG2 is expressed as $$f2 = (y1 \times y2 \times y3)' \qquad (2)$$

where "×" represents the logical AND operator and "'" represents the logical NOT operator.

Since the clock gate CG3 receives the output from an OR circuit as the control signal, the CG function f3 of the clock gate CG3 is expressed as $$f3 = y1' + y2 + y3 \qquad (3)$$

where "+" is logical OR operator.

Based on the CG function fi calculated by the CG function calculating unit 402, the conversion table generating unit 403 generates a conversion table T1 of the conversion of FF output value combinations to the CG state, the FF output values being input sources.

Specifically, a truth table is generated as the conversion table T1 to perform conversion on the combinations of the output values yj from the FFs that are the input sources to the clock gate CGi and on the combinations of the CG functions fi of the clock gate CGi.

Figure 5:
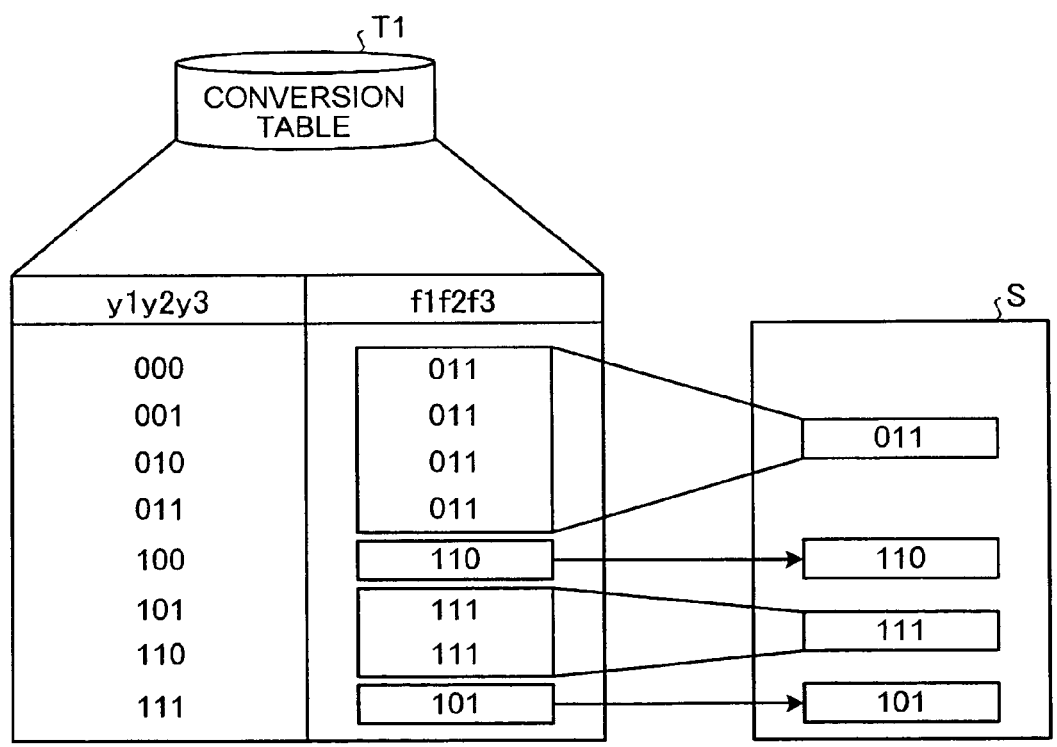
FIG. 5 is a schematic of a conversion table for the circuit shown in FIG. 2.

The circuit 200 of FIG. 2 will be taken as an example for description. FIG. 5 is a schematic of the conversion table T1 for the circuit 200 shown in FIG. 2. Since the input-source FFs of the clock gate CG1 to CG3 are the FF 1 to FF 3 and the output values thereof are y1, y2, and y3, respectively, eight patterns of the output value combination {y1, y2, y3} exist. By substituting the eight patterns of the combination {y1, y2, y3} for the CG functions f1 to f3, the converted combination {f1, f2, f3} can be obtained.

In the case of the CG function fi=1, since the local clock LCi is in the active state, the local clock LCi is supplied to the clock terminals of the FFs in the FF group. Therefore, {f1, f2, f3} shown in FIG. 5 directly represents the clock gating state, and "1" and "0" represent the active state and the inactive state, respectively.

For example, in FIG. 5, if {f1, f2, f3}={0, 1, 1}, this represents that the clock gate CG1 terminates the supply of the local clock LC1 to the clock terminals of the FFs in the FF group A1, that the clock gate CG2 supplies the local clock LC2 to the clock terminals of the FFs in the FF group A2, and that the clock gate CG3 supplies the local clock LC3 to the clock terminals of the FFs in the FF group A3.

As shown in FIG. 4, the CG all-state group output unit 404 outputs a CG all-state group S based on the conversion table T1 generated by the conversion table generating unit 403. The CG all-state group S is a CG state group including all the CG states possible.

Specifically, for example, since the conversion table T1 covers all the combinations of the output values {y1, y2, y3} of the FF 1 to FF 3 that are the input sources of the clock gate CG1 to CG3, the CG all-state group S can be acquired by organizing the conversion results, i.e., the CG state {f1, f2, f3}.

For example, the conversion table T1 shown in FIG. 5, although up to eight CG states emerge because the CG state {f1, f2, f3} is a combination of the CG functions f1 to f3, the CG state {f1, f2, f3} can take on four patterns, which include {0, 1, 1}, {1, 1, 0}, {1, 1, 1}, and {1, 0, 1} since overlapping CG states exist.

Figure 6:
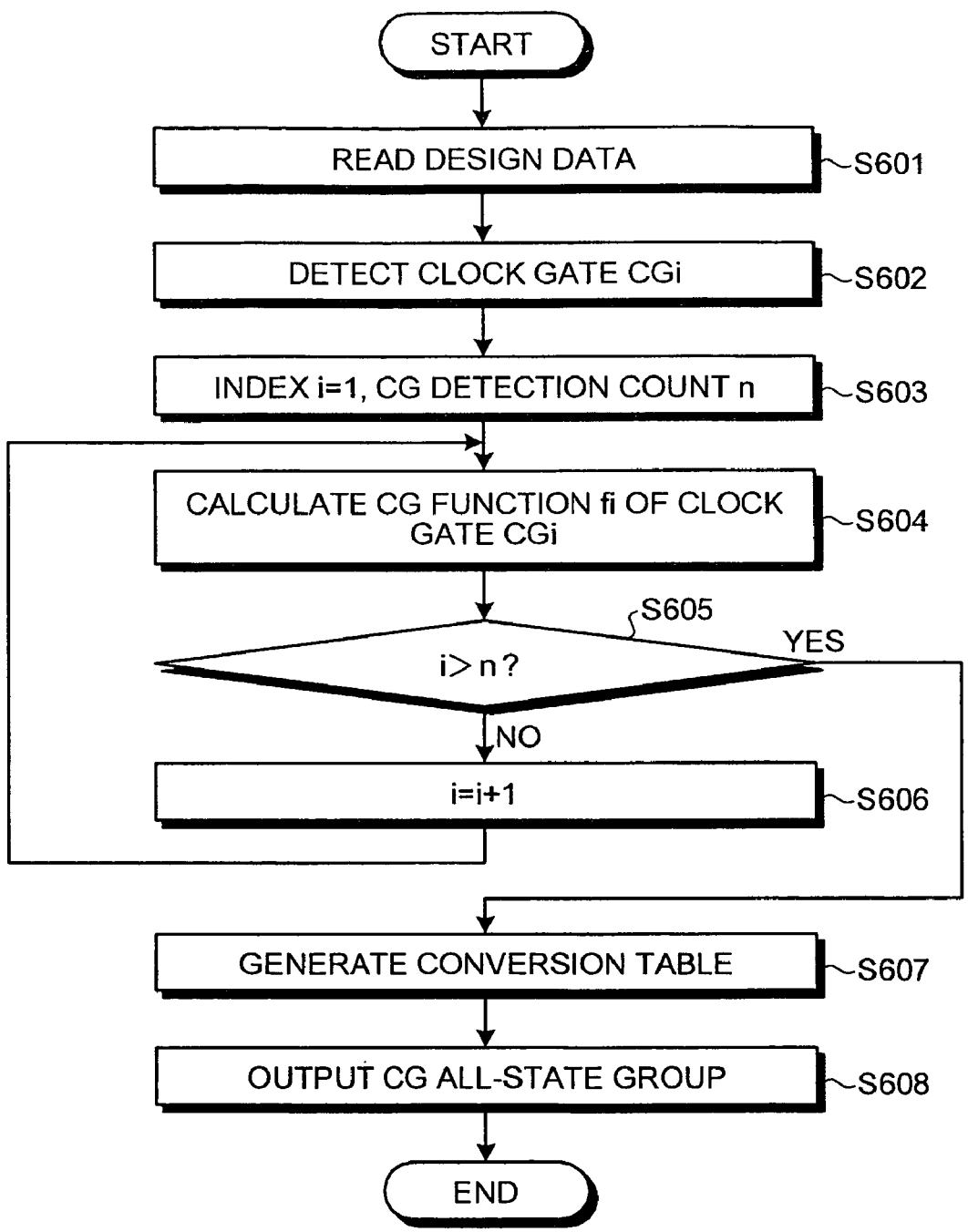
FIG. 6 is a flowchart of a first clock gating analyzing process of the clock gating analyzing apparatus.

FIG. 6 is a flowchart of a first clock gating analyzing process of the clock gating analyzing apparatus 100. First, the design data 400 stored in the memory are read (step S601) and the clock gate detecting unit 401 detects the clock gate CGi in the circuit 200 (step S602). The index i=1 and the clock gate detection count n are defined for the clock gate CGi (step S603), and the CG function calculating unit 402 calculates the CG function fi of the clock gate CGi (step S604).

It is determined whether i>n is satisfied (step S605), and if i>n is not satisfied (step S605: NO), i is incremented by one (step S606) and the process returns to step S604. On the other hand, if i>n is satisfied (step S605: YES), the conversion table generating unit 403 creates the conversion table T1 (step S607). The CG all-state group output unit 404 outputs the CG all-state group S (step S608).

According to the first configuration and the first clock gating analyzing process of the clock gating analyzing apparatus 100, a mutual change in the state of the clock gate CGi can be automatically generated for each time-point.

In a second configuration, the CG all-state group S generated by the first configuration shown in FIG. 4 is used to calculate a state coverage rate of the CG state and to generate an input pattern that increases the state coverage rate. The same reference numerals refer to the same constituent elements as those shown in FIG. 4 and description thereof is omitted.

Figure 7:
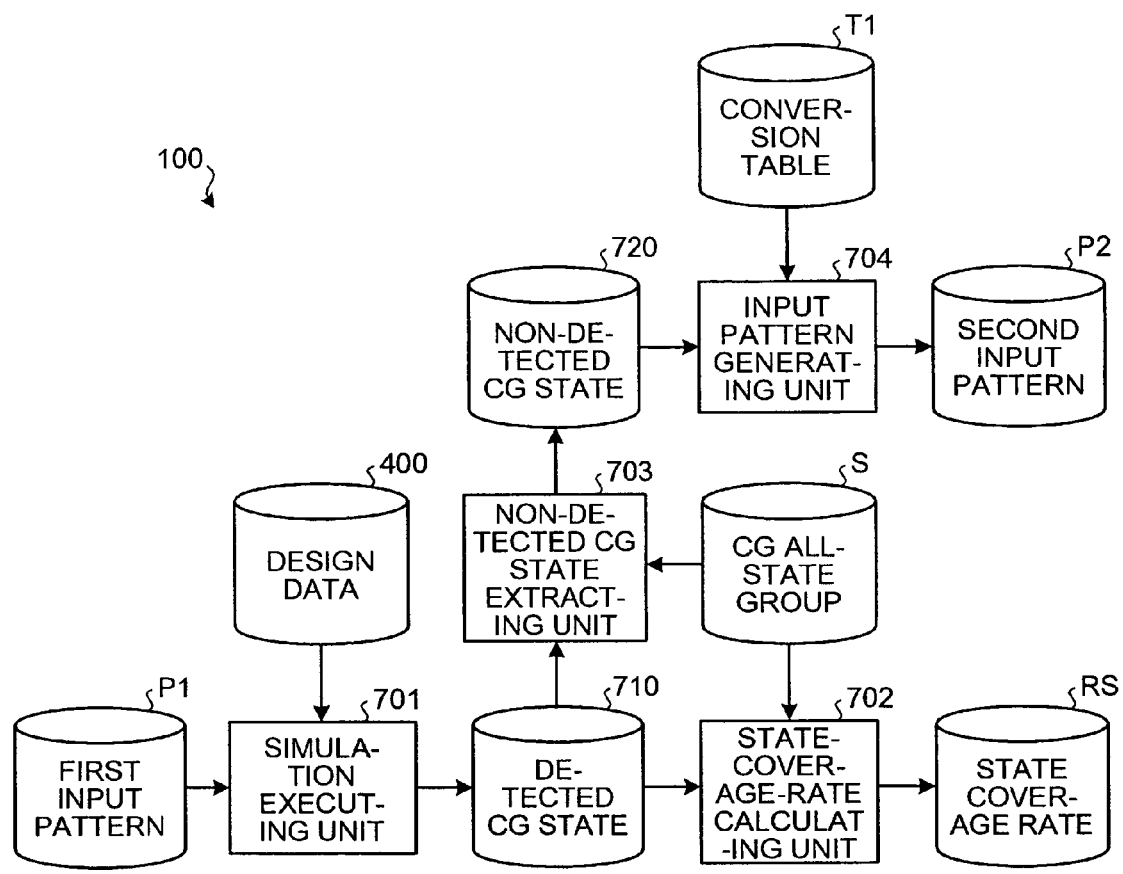
FIG. 7 is a functional diagram of a second configuration of the clock gating analyzing apparatus.

FIG. 7 is a functional diagram of the second configuration of the clock gating analyzing apparatus 100. The clock gating analyzing apparatus 100 includes a simulation executing unit 701, a state-coverage-rate calculating unit 702, a non-detected CG state extracting unit 703, and an input pattern generating unit 704. The functions of the units 701 to 704 can be realized by executing, with the CPU, relevant programs stored in the memory.

The output data from the units 701 to 704 are stored in the memory. Functional constituent elements at the destinations of connection indicated by arrows shown in FIG. 7 read, from the memory, the output data from functional constituent elements at the sources of connection and the CPU executes the programs related to the functions.

First, the simulation executing unit 701 inputs an arbitrary input pattern (hereinafter, "first input pattern P1") P1 to the design data 400 to execute a circuit simulation of the circuit 200. The simulation executing unit 701 can be realized by an existing analysis tool. The CG state is detected for each time-point from the simulation result. The CG state detected from the simulation result of the simulation executing unit 701 is referred to as a "detected CG state 710".

Since the CG all-state group S covers all the CG states generated in the circuit 200, all the detected CG states 710 are included in the CG all-state group S.

The state-coverage-rate calculating unit 702 calculates a state coverage rate RS, which is a rate of the detected CG states 710 covering the CG all-state group S. That is, the state coverage rate RS is calculated by defining the number of CG-states in the CG all-state group S as a denominator value and number of the detected CG states 710 as a numerator value. For example, if the three detected CG states 710 exist which are {011}, {110}, and {111}, three CG states are covered in the CG all-state group S shown in FIG. 5 and, therefore, the state coverage rate RS is 3/4.

The non-detected CG state extracting unit 703 extracts the CG states other than the detected CG states 710 from the CG all-state group S shown in FIG. 5 (hereinafter, "non-detected CG state 720"). For example, if {011}, {110}, and {111} are the detected CG states 710 from the CG all-state group S shown in FIG. 5, while {101} is identified as the non-detected CG state 720.

The input pattern generating unit 704 generates an input pattern covering the non-detected CG states (hereinafter, a "second input pattern P2"). The input pattern generating unit 704 will specifically be described.

Figure 8:
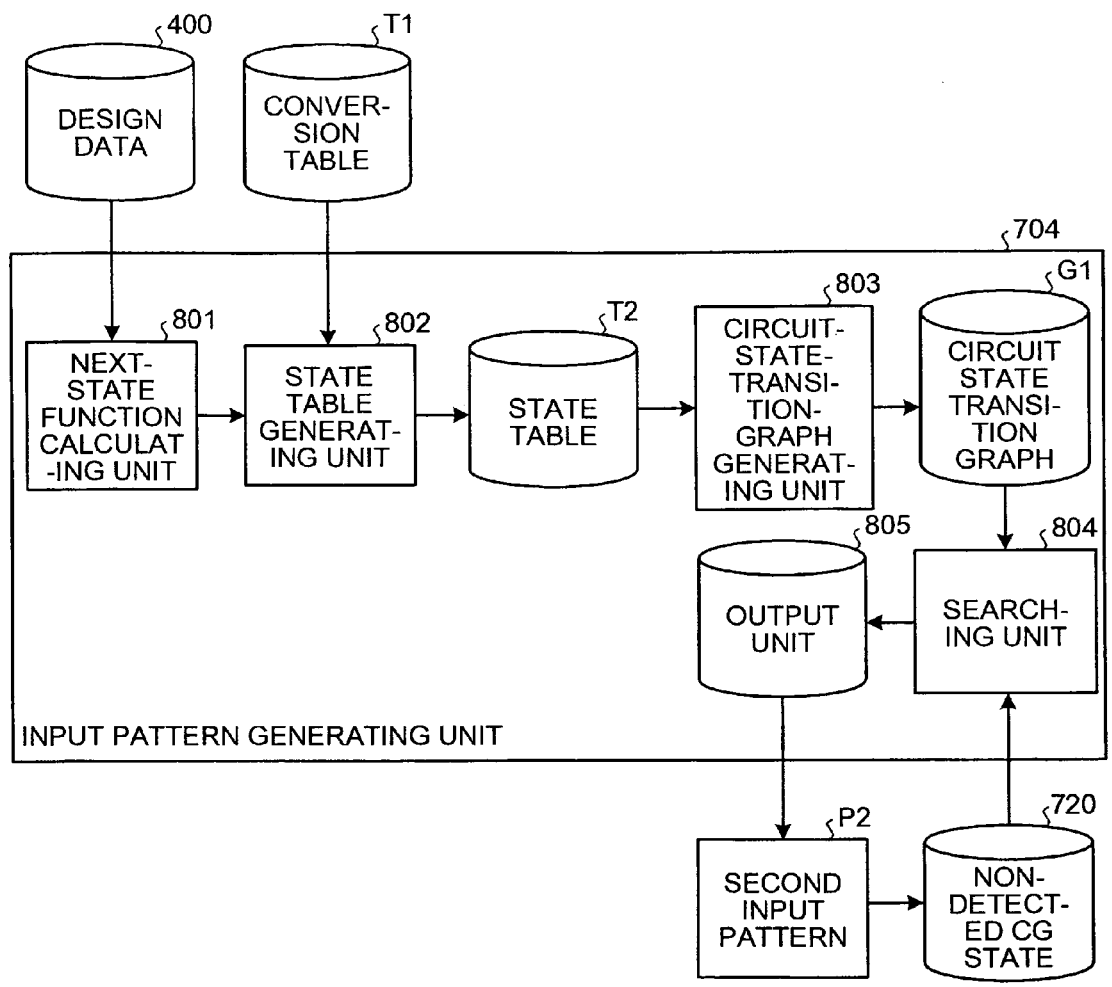
FIG. 8 is a block diagram of a detailed functional configuration of an input pattern generating unit.

FIG. 8 is a detailed functional diagram of the input pattern generating unit 704. The input pattern generating unit 704 includes a next-state function calculating unit 801, a state table generating unit 802, a circuit-state-transition-graph generating unit 803, a searching unit 804, and an output unit 805. The next-state function calculating unit 801 analyzes the design data 400 to calculate a next-state function zj of the FFs. The next-state function zj is a function indicating an output of each FF at the next time-point.

The circuit 200 shown in FIG. 2 is used for description. Since x1 is input to the FF 1 at each time-point, a next-state function z1 is expressed as $$f1 = x1 \quad (4)$$

If y1 to y3 are output from the FF 1 to FF 3 at the current time-point, the output of the AND circuit on the input side of the FF 2 is received as the output of the FF 2 at the next time-point. Therefore, a next-state function z2 is expressed as $$z2 = y1' \times y3 \quad (5)$$

If y1 to y3 are output from the FF 1 to FF 3 at the current time-point, the output of the NOR circuit on the input side of the FF 3 is received as the output of the FF 3 at the next time-point. Therefore, a next-state function z3 is expressed as $$z3 = (y1 + y2)' \quad (6)$$

The state table generating unit 802 generates a state table T2 based on the next-state function zj calculated by the next-state function calculating unit 801 and the conversion table T1. The state table T2 is a table correlating the input pattern x1, the FF output {y1, y2, y3} at the current time-point, the FF output {z1, z2, z3} at the next time-point, the CG state {f1, f2, f3} at the current time-point, and the CG state {g1, g2, g3} at the next time-point.

Figures 9, 10:
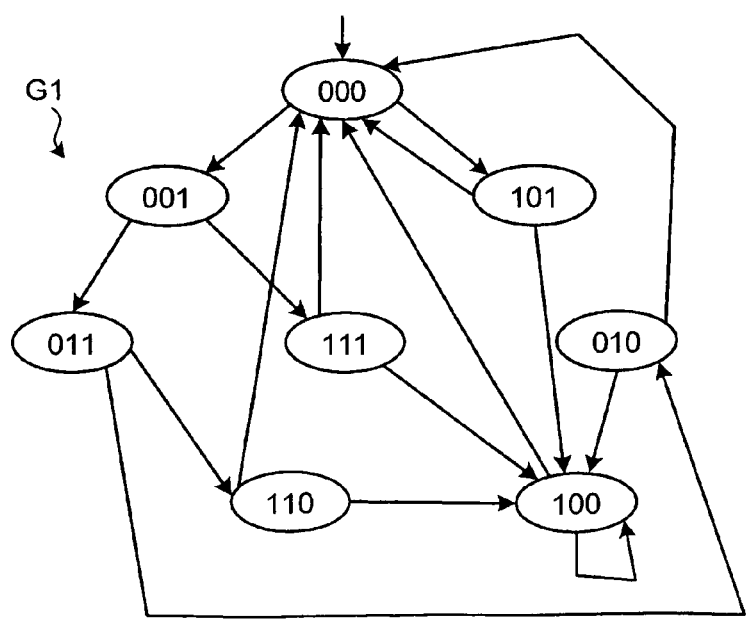
FIG. 9 is a schematic of a state table related to the circuit 200 shown in FIG. 2.
FIG. 10 is a schematic of a circuit state transition graph.

FIG. 9 is a schematic of the state table T2 related to the circuit 200 shown in FIG. 2. A first column from the left of the state table T2 shows values of the input x1. A second column shows values of the FF output {y1, y2, y3} at the current time-point. It is assumed here that the values of the initial state are {y1, y2, y3}={0, 0, 0}.

A third column shows values of the FF output {z1, z2, Z3} at the next time-point. The values of {z1, z2, Z3} indicate the next output values of {y1, y2, y3} on the left thereof.

A fourth column shows the CG state {f1, f2, f3} at the current time-point. The values of {f1, f2, f3} are values acquired by converting the values of the FF output {y1, y2, y3} at the current time-point with the use of the conversion table T1.

A fifth column shows the CG state {g1, g2, g3} at the next time-point. The values of {g1, g2, g3} are values acquired as a conversion result {f1, f2, f3} of the conversion performed by substituting the values of the FF output {z1, z2, z3} at the next time-point for {f1, f2, f3} of the conversion table T1.

As shown in FIG. 8, the circuit-state-transition-graph generating unit 803 generates a state transition graph G1 (hereinafter, a "circuit state transition graph G1") of the circuit 200 with the use of the two columns on the left side of the state table T2. However, since the object is to obtain the clock gate function, the FFs to be considered as the state of the circuit include only an FF included in the clock gate function and an FF considered as the state of the FF circuit included in the next state function of that FF. FIG. 10 is a schematic of the circuit state transition graph G1.

Numeric strings surrounded by ellipses are nodes representing the output of the FFs (values of the FF output {y1, y2, y3} at the current time-point), and arrows represent state transition branches. Nodes at the start of the arrows are nodes of transition sources, and nodes at the end of the arrows are nodes of transition destinations (the values of the FF output {z1, z2, z3} at the next time-point). A node {000} is a node representing the initial state.

The searching unit 804 assumes the non-detected clock gating state 720 as the clock gating state of the next time-point to search the circuit state transition graph G1 for the state transition branch(es) from a combination of FF output values at the next time-point (corresponding to the non-detected clock gating state 720) to the initial state. Specifically, in the circuit state transition graph G1, the searching unit 804 searches for the second input pattern P2, which is a value of the input x1 and a time-point at the time of each state transition from the FF output {y1, y2, y3}={0, 0, 0} in the initial state to the values of the FF output {z1, z2, z3} at the next time-point causing the non-detected CG state 720 to emerge.

The output unit 805 outputs the second input pattern P2 obtained by the searching unit 804. Specifically, for example, the second input pattern P2 may be stored in the memory or may be output from the output device.

The searching process of the searching unit 804 will be described in detail. The state table T2 is searched for a value of the input x1 that causes the CG state at the next time-point to become the non-detected CG state 720, the FF output at the current time-point, and the FF output at the next time-point.

Figures 11, 12:
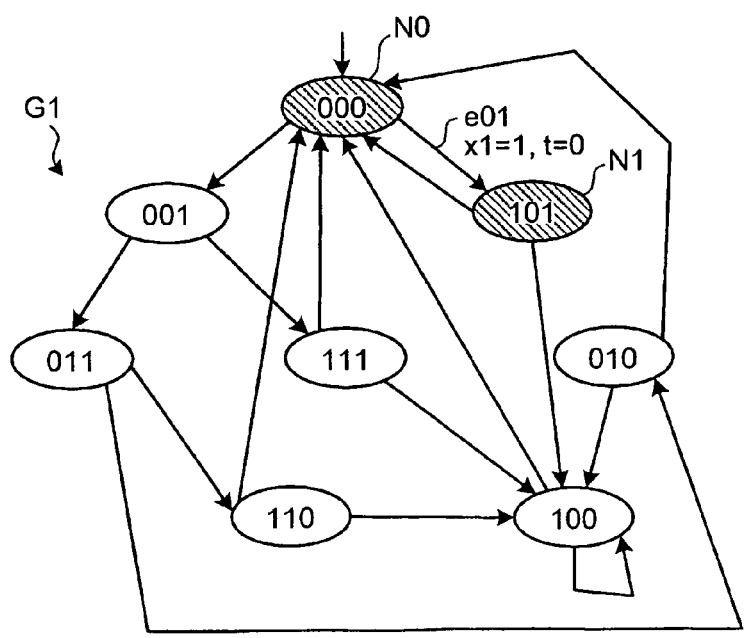
FIG. 11 is a schematic of a first search example of the state table.
FIG. 12 is a schematic of an example of state transition branch detection from a search result shown in FIG. 11.

FIG. 11 is a schematic of a first search example of the state table T2. For example, if the non-detected CG state 720 is {111}, the state table T2 is searched for x1, {y1, y2, y3}, and {z1, z2, z3} that cause the CG state at the next time-point to become {g1, g2, g3}={111} (shown by hatching in FIG. 11).

From the circuit state transition graph G1, a state transition branch is then detected for the search result, i.e., from the value of the FF output {y1, y2, y3} at the current time-point to the value of the FF output {z1, z2, z3} at the next time-point. FIG. 12 is a schematic of an example of state transition branch detection from the search result shown in FIG. 11.

The search result shown in FIG. 11 includes {y1, y2, y3}={000} and {z1, z2, z3}={101}. Therefore, a state transition branch e01 is detected which transitions from a node N0, i.e., {000} to a node N1, i.e., {101}. It can be known from the search result shown in FIG. 11 that the value of the input x1 at the time of the state transition of the state transition branch e01 is x1=1.

It is determined whether the state transition source, i.e., the node N0 is a node in the initial state. Since the value of the node N0 is {y1, y2, y3}={000}, the node is in the initial state. Therefore, a time-point t=0 is correlated with the value (x1=1) of the input x1 at the time of the state transition of the state transition branch e01, and the identified input pattern (the second input pattern P2) is "the input x1=1 at the time-point t=0 (initial state)".

Figures 13, 14:
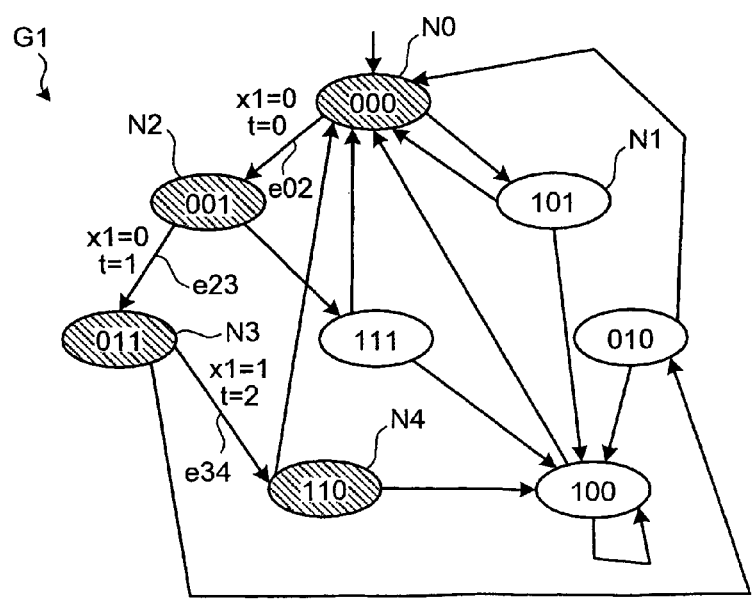
FIG. 13 is a schematic of a second search example of the state table.
FIG. 14 is a schematic of an example of the state transition branch detection from the search result shown in FIG. 13.

If the non-detected CG state 720 is {111}, another set of x1, {y1, y2, y3}, and {z1, z2, z3} exists that causes the CG state at the next time-point to become {g1, g2, g3}={111}. FIG. 13 is a schematic of a second search example of the state table T2. In FIG. 13, the search result in this case is a row indicated by a reference numeral 1301 (shown by hatching).

From the circuit state transition graph G1, a state transition branch is detected for the search result, i.e., from the value of the FF output {y1, y2, y3} at the current time-point to the value of the FF output {z1, z2, z3} at the next time-point. FIG. 14 is a schematic of an example of the state transition branch detection from the search result shown in FIG. 13.

The search result shown in FIG. 13 includes {y1, y2, y3}={011} and {z1, z2, z3}={110}. Therefore, a state transition branch e34 is detected which transitions from a node N3, i.e., {011} to a node N4, i.e., {110}. It can be known from a row 1301 of the search result shown in FIG. 13 that the value of the input x1 at the time of the state transition of the state transition branch e34 is x1=1.

It is determined whether the state transition source, i.e., the node N3 is a node in the initial state. Since the value of the node N3 is {y1, y2, y3}={011}, the node is not in the initial state. Therefore, a node N2 is searched for, which is a transition source having the node N3 as a state transition destination. From the state table T2, it can be known, from a row 1302 shown in FIG. 13, that the value of the input x1 at the time of the state transition from the node N2 to the node N3 is x1=0.

It is determined whether the state transition source, i.e., the node N2 is a node in the initial state. Since the value of the node N3 is {y1, y2, y3}={001}, the node is not in the initial state. Therefore, a node N0 is searched for, which is a transition source having the node N2 as a state transition destination. From the state table T2, it can be known, from a row 1303 shown in FIG. 13, that the value of the input x1 at the time of the state transition from the node N0 to the node N2 is x1=0.

It is determined whether the state transition source, i.e., the node N0 is a node in the initial state. Since the value of the node N0 is {y1, y2, y3}={000}, the node is in the initial state. In this search process, on the circuit state transition graph G1, the state transition (e02) occurs at the time-point t=0 from the node N0 to the node N2; the state transition (e23) occurs at the next time-point t=1 from the node N2 to the node N3; and the state transition (e34) occurs at the next time-point t=2 from the node N3 to the node N4. Therefore, the values of the input x1 of the state transition branches e02, e23, and e34 are correlated with each time-point t.

Therefore, another obtained input pattern (the second input pattern P2) is "the input x1=0 at the time-point t=0 (initial state), the input x1=0 at the time-point t=1, and the input x1=1 at the time-point t=2". This pattern may be a pattern for detecting the non-detected state {110}. The non-detected CG state 720 is generated by applying the identified second input pattern P2 to the circuit 200.

Figure 15:
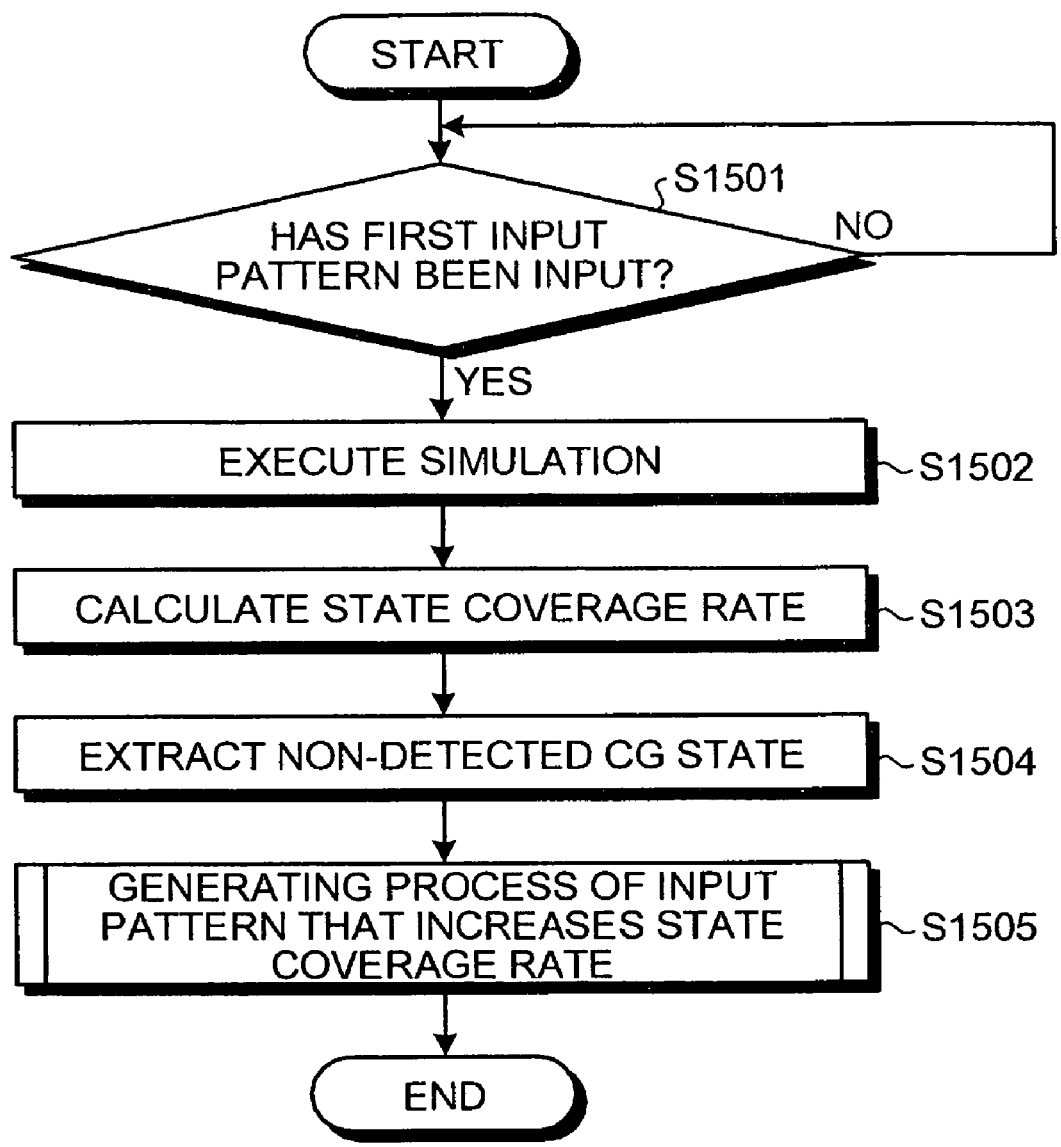
FIG. 15 is a flowchart of a second clock gating analyzing process.

The second clock gating analyzing process is a process for the second configuration shown in FIG. 7. FIG. 15 is a flowchart of the second clock gating analyzing process.

First, waiting for input of the first input pattern P1 occurs (step S1501: NO). If the first input pattern P1 has been input (step S1501: YES), the simulation executing unit 701 executes a circuit simulation of the circuit 200 (step S1502).

The state-coverage-rate calculating unit 702 calculates a state coverage rate RS indicating how much of the CG all-state group S is covered by the detected CG states 710 acquired as the result of the execution of the circuit simulation (step S1503). The non-detected CG state extracting unit 703 extracts the non-detected clock gating state 720, which is the CG state other than the detected CG states 710, from the CG all-state group S (step S1504). A process is then executed to generate an input pattern that increases the state coverage rate RS (step S1505).

Figure 16:
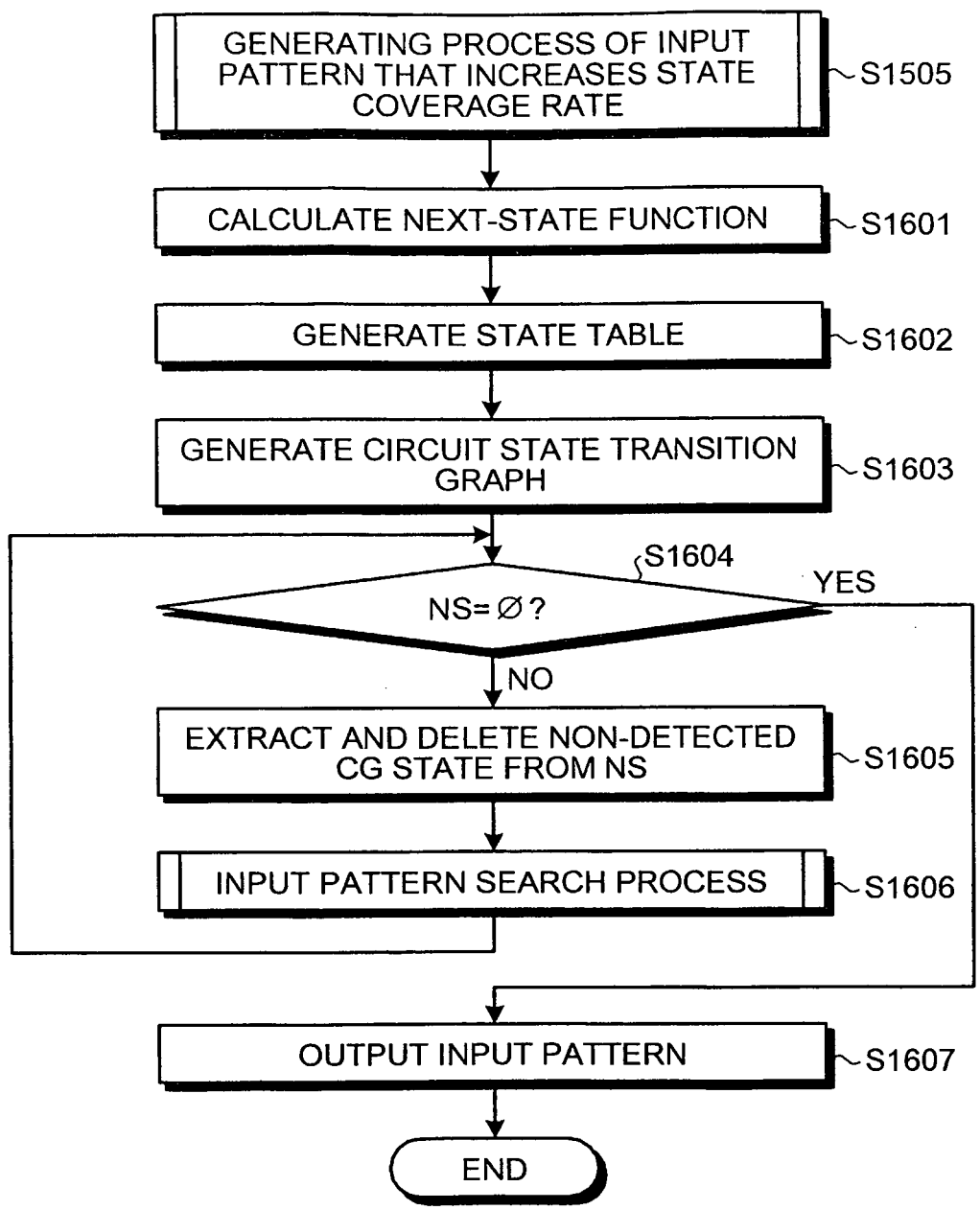
FIG. 16 is a flowchart of the process of generating an input pattern that increases the state coverage rate RS shown at step S1505.

FIG. 16 is a flowchart of the process of generating the input pattern that increases the state coverage rate RS shown at step S1505. First, the next-state function calculating unit 801 calculates the next-state function zj of the FFs in the circuit 200 (step S1601). The state table generating unit 802 then generates the state table T2 (step S1602). The circuit-state-transition-graph generating unit 803 generates the circuit state transition graph G1 (step S1603).

It is determined whether NS=Ø (null set) (step S1604). The NS is a group of the non-detected clock gating states 720. If NS≠Ø (step S1604: NO), the arbitrary non-detected clock gating state 720 is extracted from the NS and the non-detected clock gating state 720 is deleted from the NS (step S1605).

The searching unit 804 executes an input pattern search process (step S1606). The details of the input pattern search process will be described later. The process then returns to step S1604. If NS=Ø at step S1604 (step S1604: YES), the output unit 805 outputs the search result as the input pattern (the second input pattern P2) that increases the state coverage rate RS (step S1607).

Figure 17:
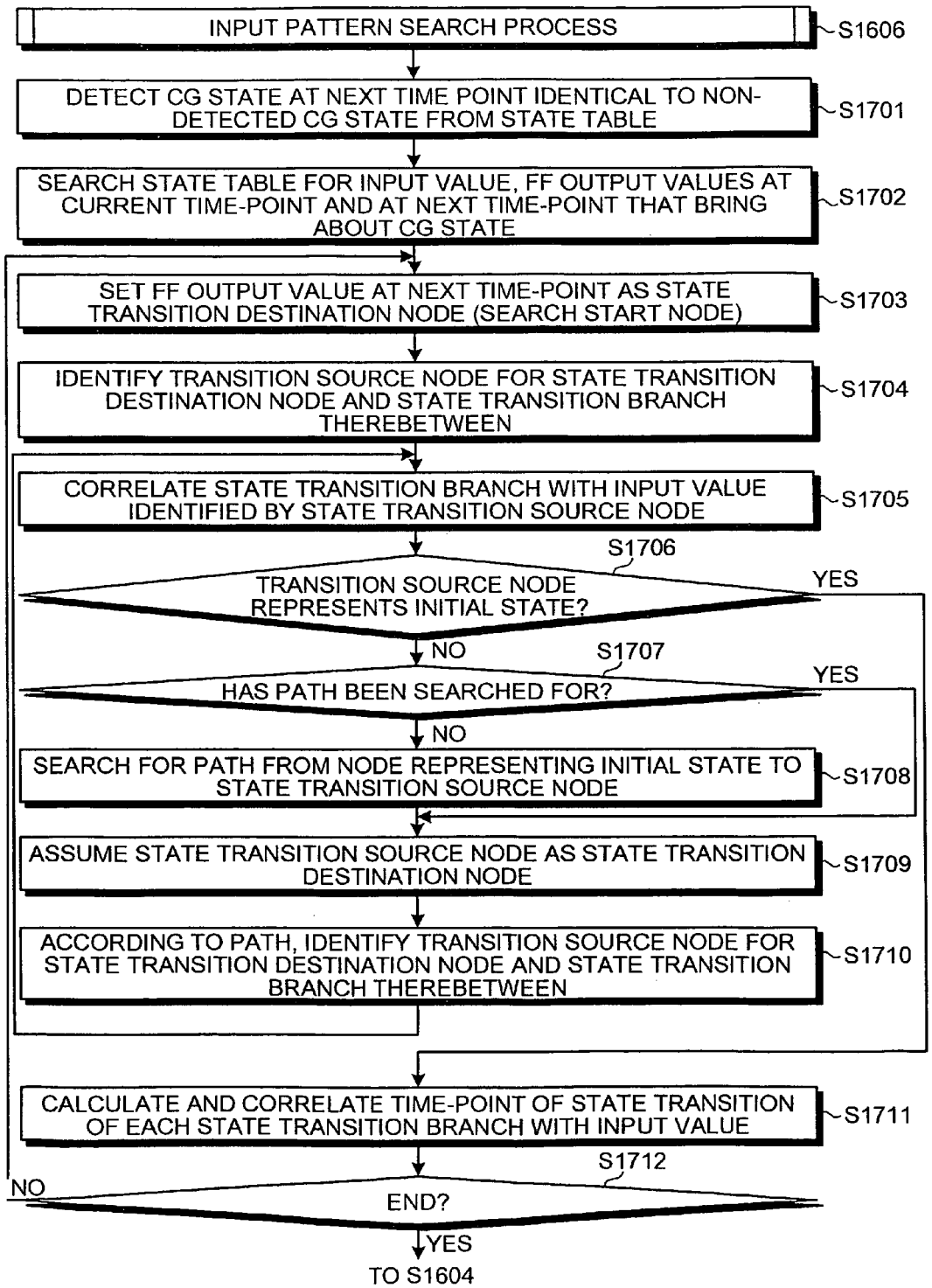
FIG. 17 is a flowchart of a procedure of an input pattern search process shown at step S1606.

FIG. 17 is a flowchart of a procedure of the input pattern search process shown at step S1606. First, the CG state at the next time-point (corresponding to the non-detected clock gating state 720) is detected from the state table T2 (step S1701). The state table T2 is searched for the value of the input x1, the value of the FF output {y1, y2, y3} at the current time-point, and the value of the FF output {z1, z2, z3} at the next time-point that bring about the detected CG state (step S1702).

The value of the FF output {z1, z2, z3} at the next time-point is assumed as a state transition destination node (search start node) (step S1703), and a transition source node for the transition destination node and a state transition branch between these nodes are identified from the circuit state transition graph G1 (step S1704).

The identified state transition branch is correlated with a value of the input x1 identified by the transition source node (FF output {y1, y2, y3} at the current time-point) (step S1705). It is determined at this point whether the transition source node is a node representing the initial state (step S1706). If the node does not represent the initial state (step S1706: NO), it is determined whether a path has already been searched for from the node representing the initial state to the transition source node (step S1707).

If the path has already been searched for (step S1707: YES), the process returns to step S1709. On the other hand, if the path has not already been searched for (step S1707: NO), the path is searched for from the node representing the initial state to the transition source node (step S1708). The transition source node is newly assumed as the transition destination node (step S1709), and a transition source node for that transition destination node and a state transition branch between these nodes are identified from the circuit state transition graph G1 according to the identified path (step S1710). The process then returns to step S1705.

On the other hand, if the transition source node is a node representing the initial state at step S1706 (step S1706: YES), the time-points of the state transitions of the identified state transition branches are calculated from the circuit state transition graph G1 and are correlated with the values of the input x1 of the state transition branches (step S1711).

It is then determined whether to terminate the process (step S1712), specifically, if another value is included in the FF output {z1, z2, z3} at the next time-point identified at step S1702, the process is not terminated (step S1712: NO) and returns to step S1703, and if no other value is included in the FF output {z1, z2, z3} at the next time-point searched at step S1702, the process returns to step S1604 shown in FIG. 16.

According to the second configuration and the second clock gating analyzing process of the clock gating analyzing apparatus 100, verification oversights of clock gate function bugs causing a function bug in the circuit 200 can be reduced by obtaining the state coverage rate RS and increasing the state coverage rate RS at the time of the function verification of the circuit 200 by simulation.

The state coverage rate RS can be automatically increased by generating the second input pattern P2 that causes the CG state(s) not covered (non-detected clock gating state 720) to emerge, thereby enabling verification oversights of clock gate function bugs causing function bugs in the circuit 200 to be prevented.

According to the third configuration, the CG all-state group S generated by the first configuration shown in FIG. 4 is used to calculate a state transition branch coverage rate of the CG state transition branches and to generate an input pattern that increases the state transition branch coverage rate. The same reference numerals refer to the same constituent elements as those shown in FIGS. 4, 7, and 8 and description thereof is omitted.

Figure 18:
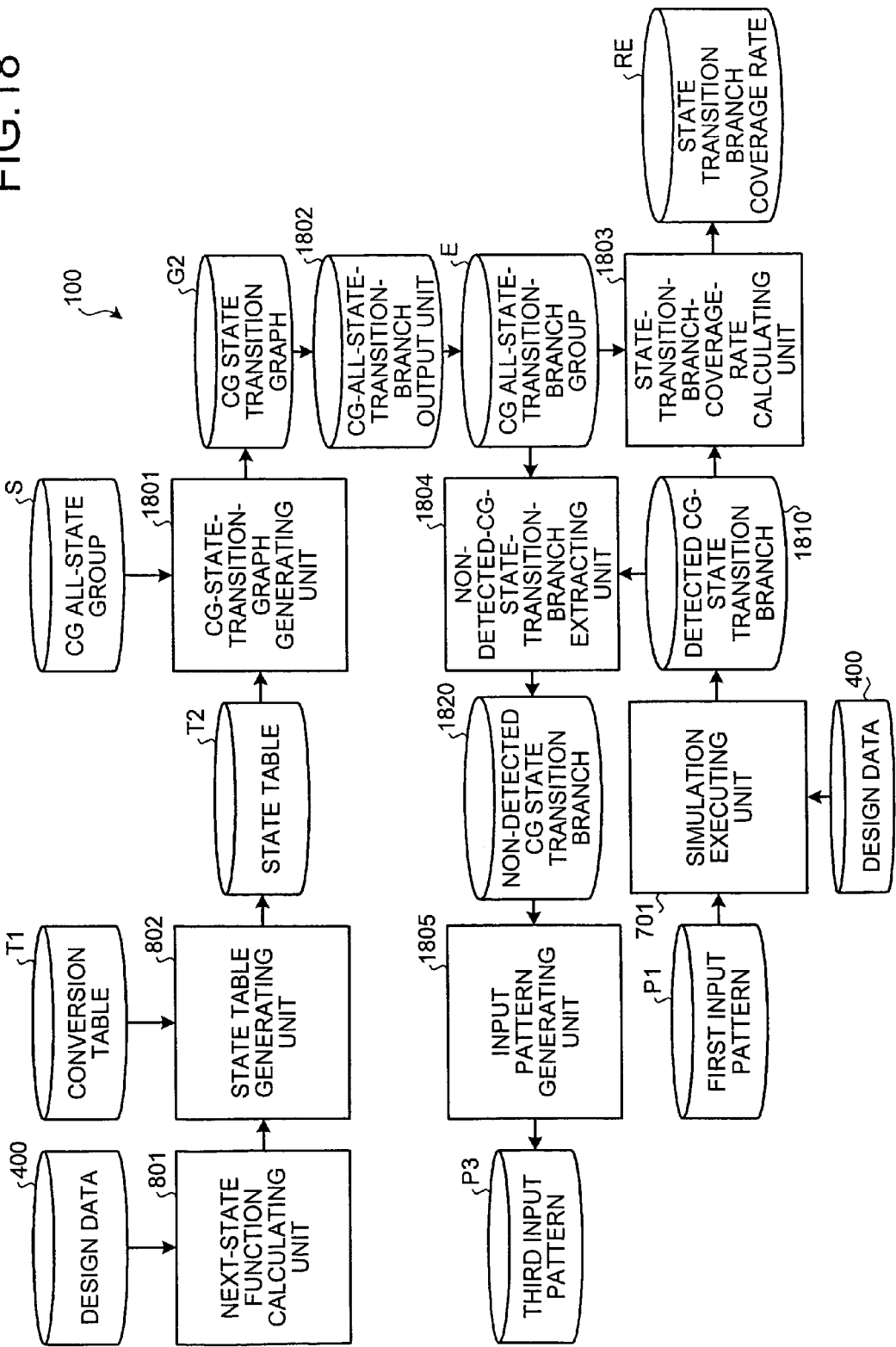
FIG. 18 is a functional diagram of a third configuration of the clock gating analyzing apparatus.

FIG. 18 is a functional diagram of the third configuration of the clock gating analyzing apparatus 100. The clock gating analyzing apparatus 100 includes the simulation executing unit 701, the next-state function calculating unit 801, the state table generating unit 802, a CG-state-transition-graph generating unit 1801, a CG-all-state-transition-branch output unit 1802, a state-transition-branch-coverage-rate calculating unit 1803, a non-detected-CG-state-transition-branch extracting unit 1804, and an input pattern generating unit 1805. The functions of the units 701, 801, 802, and 1801 to 1805 can be realized by executing, by the CPU, relevant programs stored in the memory.

The output data from the units 701, 801, 802, 1801 to 1805 are stored in the memory. Functional constituent elements at the destinations of connections indicated by arrows shown in FIG. 18 read, from the memory, the output data from functional constituent elements at the sources of connections and the CPU executes programs related to the functions.

Figure 19:
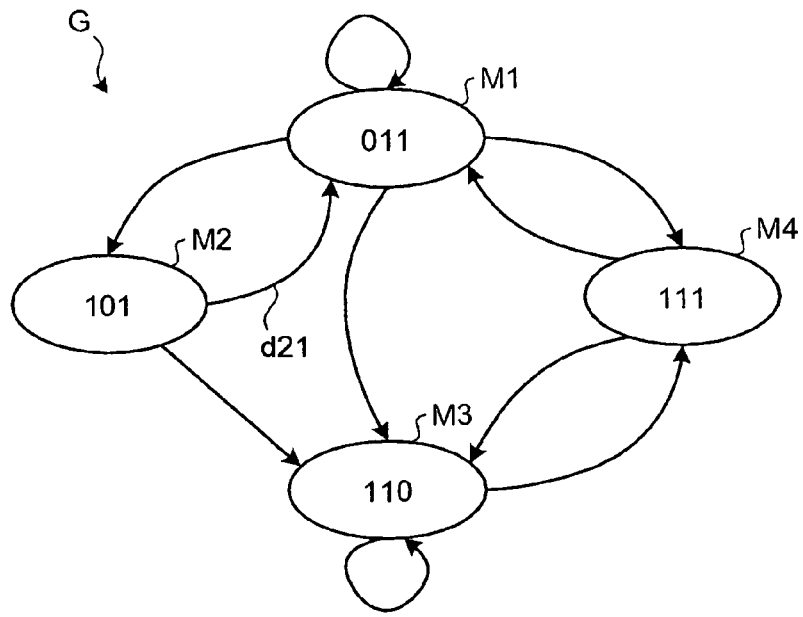
FIG. 19 is a schematic of the CG state transition graph.

The CG-state-transition-graph generating unit 1801 uses the state table T2 to generate a CG state transition graph G2 representing the state transitions of the CG states. FIG. 19 is a schematic of the CG state transition graph G2. Nodes M1 to M4 represent the CG states and arrows represent the state transition branches. The state transition branch is created by the state transition from a value of {y1, y2, y3} representing the CG state at the current time-point to a value of {z1, z2, Z3} representing the CG state at the next time-point in the state table T2.

As shown in FIG. 18, the CG-all-state-transition-branch output unit 1802 extracts and outputs, as a CG all-state transition branch group E, all the state transition branches of the clock gating states from the CG state transition graph G2 created by the CG-state-transition-graph generating unit 1801. Specifically, the CG all-state transition branch group E is stored in the memory.

The state-transition-branch-coverage-rate calculating unit 1803 calculates a state transition branch coverage rate of the circuit 200. Specifically, since a CG state of each time-point is detected from the simulation result of the simulation executing unit 701, a CG state transition branch representing the state transition thereof is also detected for each time-point. The CG state transition branch detected from the simulation result of the simulation executing unit 701 is referred to as a "detected CG state transition branch 1810".

A state transition branch coverage rate RE represents how much of the CG all-state transition branch group E is covered by the detected CG state transition branches 1810. That is, the CG all-state transition branch group E is calculated by defining the number of all the branches of the CG all-state transition branch group E as a denominator value and the number of branches of the detected CG state transition branches 1810 as a numerator value. For example, if the detected CG state transition branches 1810 are all the branches except a state transition branch d21 in FIG. 19, the number of all the branches of the CG all-state transition branch group E is nine and, therefore, the state transition branch coverage rate RE is 8/9.

As shown in FIG. 18, the non-detected-CG-state-transition-branch extracting unit 1804 extracts transition branches other than the detected CG state transition branches 1810 from the CG all-state transition branch group E (hereinafter, "non-detected CG state transition branch 1820"). For example, if the detected CG state transition branches 1810 are all the branches except the state transition branch d21 shown in FIG. 19, the transition branch d21 is extracted as the non-detected CG state transition branch 1820.

Figure 20:
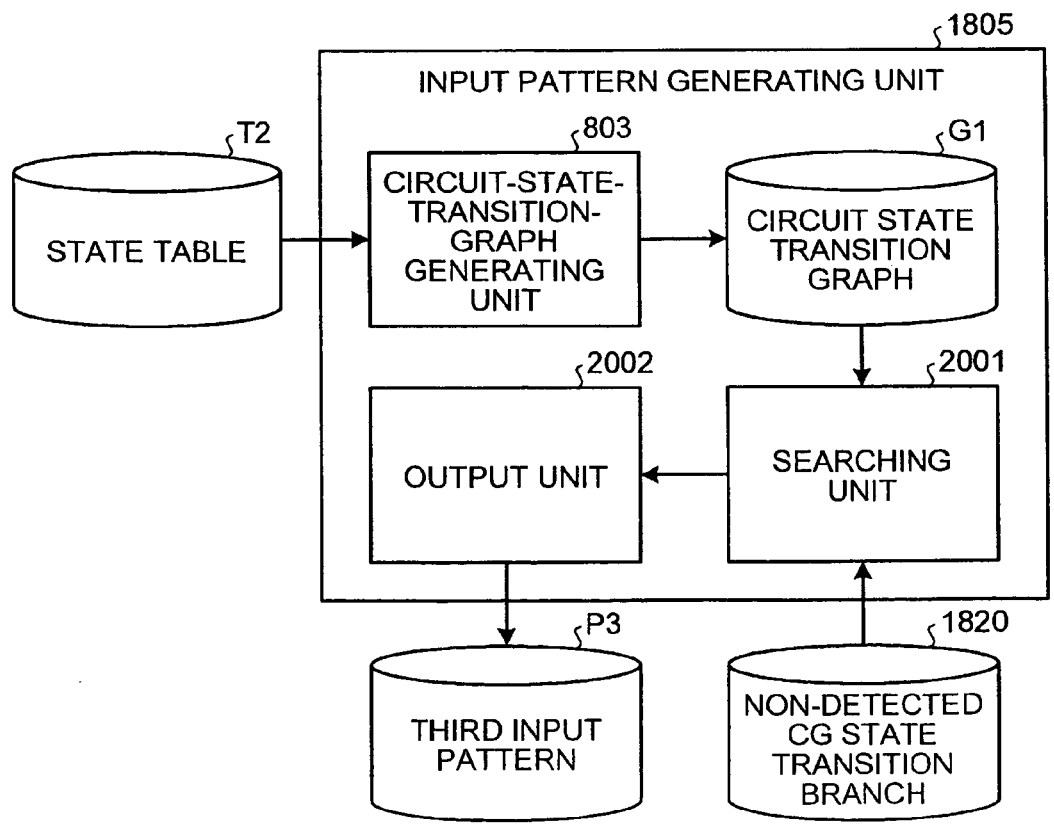
FIG. 20 is a detailed functional diagram of a configuration of another input pattern generating unit.

The input pattern generating unit 1805 generates an input pattern covering the non-detected CG state transition branches 1820 (hereinafter, a "third input pattern P3"). The input pattern generating unit 1805 will specifically be described. FIG. 20 is a detailed functional diagram of a configuration of the input pattern generating unit 1805.

The input pattern generating unit 1805 includes the circuit-state-transition-graph generating unit 803, a searching unit 2001, and an output unit 2002. The searching unit 2001 assumes the non-detected CG state transition branch 1820 as the clock gating state transition branch of the next time-point to search for the state transition from the circuit state transition branch corresponding to the non-detected CG state transition branch 1820 to the initial state in the circuit state transition graph G1 created by the circuit-state-transition-graph generating unit 803.

Specifically, in the circuit state transition graph G1, the searching unit 2001 searches for the third input pattern P3, which is a value of the input x1 and a time-point at the time of each state transition from the FF output $\{y1, y2, y3\}=\{0, 0, 0\}$ in the initial state to the values of the FF output $\{z1, z2, z3\}$ at the next time-point causing the non-detected CG state transition branch 1820 to emerge.

The output unit 2002 outputs the third input pattern P3 identified by the searching unit 2001. Specifically, for example, the third input pattern P3 may be stored in the memory or may be output from the output device.

The searching process of the searching unit 2001 will be described in detail. The searching unit 2001 detects from the CG state transition graph G2 a combination of the CG state at the current time-point (i.e., the transition source of the non-detected CG state transition branch 1820), and the CG state at the next time-point (i.e., the transition destination of the non-detected CG state transition branch 1820).

For example, as shown in FIG. 19, if the non-detected CG state transition branch 1820 is d21, the CG state $\{101\}$ of the transition source is the CG state at the current time-point, and the CG state $\{011\}$ of the transition destination is the CG state at the next time-point.

The state table T2 is searched for a value of the input x1 that causes the detected CG states at the current time-point and the next time-point to emerge, the values of the FF output $\{y1, y2, y3\}$ at the current time-point, and the values of the FF output $\{z1, z2, z3\}$ at the next time-point.

Figures 21, 22:
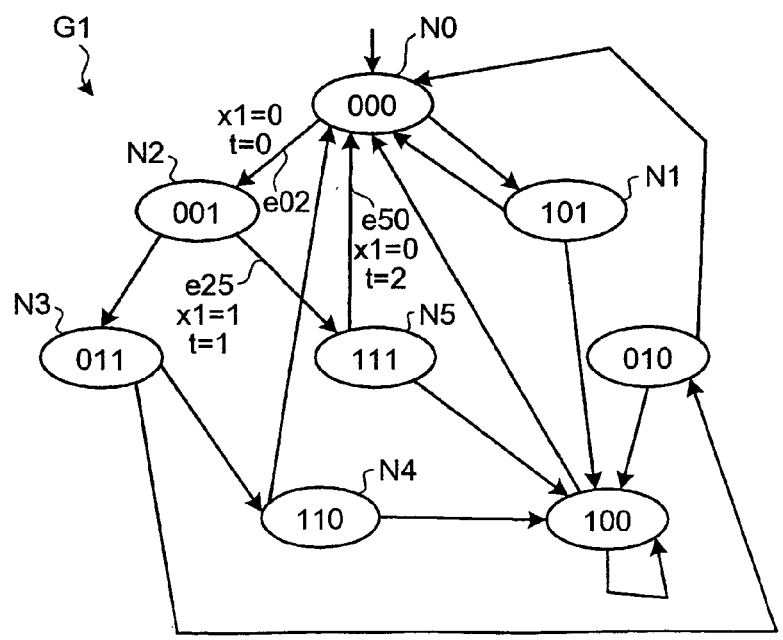
FIG. 21 is a schematic of a first search example of the state table.
FIG. 22 is a schematic of a first detection example from the circuit state transition graph.

FIG. 21 is a schematic of a first search example of the state table T2. The state table T2 is searched for a row having $\{101\}$ as the CG state of the current time-point and $\{011\}$ as the CG state at the next time-point (reference numeral 2201).

The detection from the circuit state transition graph G1 is performed for a transition source node representing the identified values of the FF output $\{y1, y2, y3\}$ at the current time-point, a transition destination node representing the FF output $\{z1, z2, z3\}$ at the next time-point, and a state transition branch representing the state transition from the transition source node to the transition destination node. The detected state transition branch is correlated with the value of the input x1 detected previously. The state transition branch detected at this point is referred to as a "tail-end state transition branch".

FIG. 22 is a schematic of a first detection example from the circuit state transition graph G1. From the state table T2, the identified value of the input x1 is x1=0; the value of the FF output $\{y1, y2, y3\}$ at the current time-point is $\{111\}$; and the output the FF output $\{z1, z2, z3\}$ at the next time-point is $\{000\}$. Therefore, a node N5 is detected as the transition source node; a node N0 is detected as the transition destination node; and a state transition branch e50 between the nodes N5 and N0 is detected as the tail-end state transition branch that causes the non-detected CG state transition branch d21 to emerge. The tail-end state transition branch e50 is correlated with x1=0.

A state transition branch one time-point before the tail-end state transition branch and a corresponding value of the input x1 at that time-point are then identified. Specifically, a row one time-point before the identified row is searched for in the state table T2. That is, a row is searched for, where the values of the FF output $\{z1, z2, z3\}$ at the next time-point is defined as the values of the FF output $\{y1, y2, y3\}$ at the current time-point of the identified row and the CG state at the next time-point is defined as the CG state at the current time-point of the identified row. In FIG. 21, a row indicated by a reference numeral 2202 is searched for as the row one time-point before the row indicated by the reference numeral 2201.

For the identified one-time-point-before row, the detection from the circuit state transition graph G1 is also performed for a transition source node representing the values of the FF output $\{y1, y2, y3\}$ at the current time-point, a transition destination node representing the FF output $\{z1, z2, z3\}$ at the next time-point, and a state transition branch representing the state transition from the transition source node to the transition destination node. The detected state transition branch is correlated with the value of the input x1 detected previously.

For example, in the case of the identified one-time-point-before row 2202, from the state table T2, the value of the input x1 in the one-time-point-before row is x1=1; the values of the FF output $\{y1, y2, y3\}$ at the current time-point are $\{001\}$; and the values of the FF output $\{z1, z2, z3\}$ at the next time-point are $\{111\}$. Therefore, the node N2 is detected as the transition source node; the node N5 is detected as the transition destination node; and a state transition branch e25 between the nodes N2 and N5 is detected as the state transition that causes the non-detected CG state transition branch d21 to emerge. The state transition branch e25 is correlated with x1=1.

It is then determined whether the transition source node detected based on the one-time-point-before row is the node N0 representing the initial state $\{000\}$ on the circuit state transition graph G1. If the node is the node N0 representing the initial state, the state transition branch correlated with the value of the input x1 is further correlated with the time-point t=0. Each time the transition to the state transition branch of the transition destination occurs, the time-point t is incremented by one time-point. If the node is not the node N0, a path from the node N0 to the transition destination node is searched for.

For example, as shown in FIG. 22, since the transition source node N2 is not the node N0, a path from the node N0 to the node N2 is searched for. Although a path for N0→N2 (the shortest path) is searched for in this case, the search can freely be performed, for example, for a number of state transition branches that exceeds a predetermined number.

The transition source node detected based on the one-time-point-before row is defined as a transition destination node to identify a transition source node and a transition branch between the nodes according the identified path. For example, as shown in FIG. 22, the transition source node N2 is defined as a transition destination node, and according to the identified path, the node N0 is defined as a transition source node.

In the state table T2, a row is searched for where the newly set transition source node is defined as the values of the FF output $\{y1, y2, y3\}$ at the current time-point and the transition destination node is defined as the values of the FF output $\{z1, z2, z3\}$ at the next time-point, and a value of the input x1 in this case is identified and correlated with the transition branch.

For example, as shown in FIG. 22, the new transition destination node is the node N2 and the new transition source node, according to the identified path, is the node NO. Therefore, as shown in FIG. 21, a row indicated by a reference numeral 2203 is searched for. Therefore, as shown in FIG. 22, the value of the input x1 (x1=1) is correlated with the transition branch e02.

If the transition source node is not the node N0 at this point, the process is further continued according to the identified path, and if the node is the node N0, the state transition branch correlated with the value of the input x1 is further correlated with the time-point t=0. Each time the transition to the state transition branch of the transition destination occurs, the time-point t is incremented by one time-point. The values of the input x1 and the time-point t correlated with the state transition branches are the input pattern (the third input pattern P3) that increases the state transition branch coverage rate RE.

For example, as shown in FIG. 22, since the transition destination node at this point is the node N2 and the transition source node is the node N0, the transition branch e02 correlated with the value of the input x1 (x1=0) is correlated with the time-point t=0 representing the initial state. Therefore, the transition branch e02 is correlated with x1=0 and t=0; the transition branch e25 is correlated with x1=1 and t=1; and the transition branch e50 is correlated with x1=0 and t=2. Therefore, the third input pattern P3 is "the input x1=0 at the time-point t=0 (initial state), x1=1 at the time-point t=1, and x1=0 at the time-point t=2".

Figure 23:
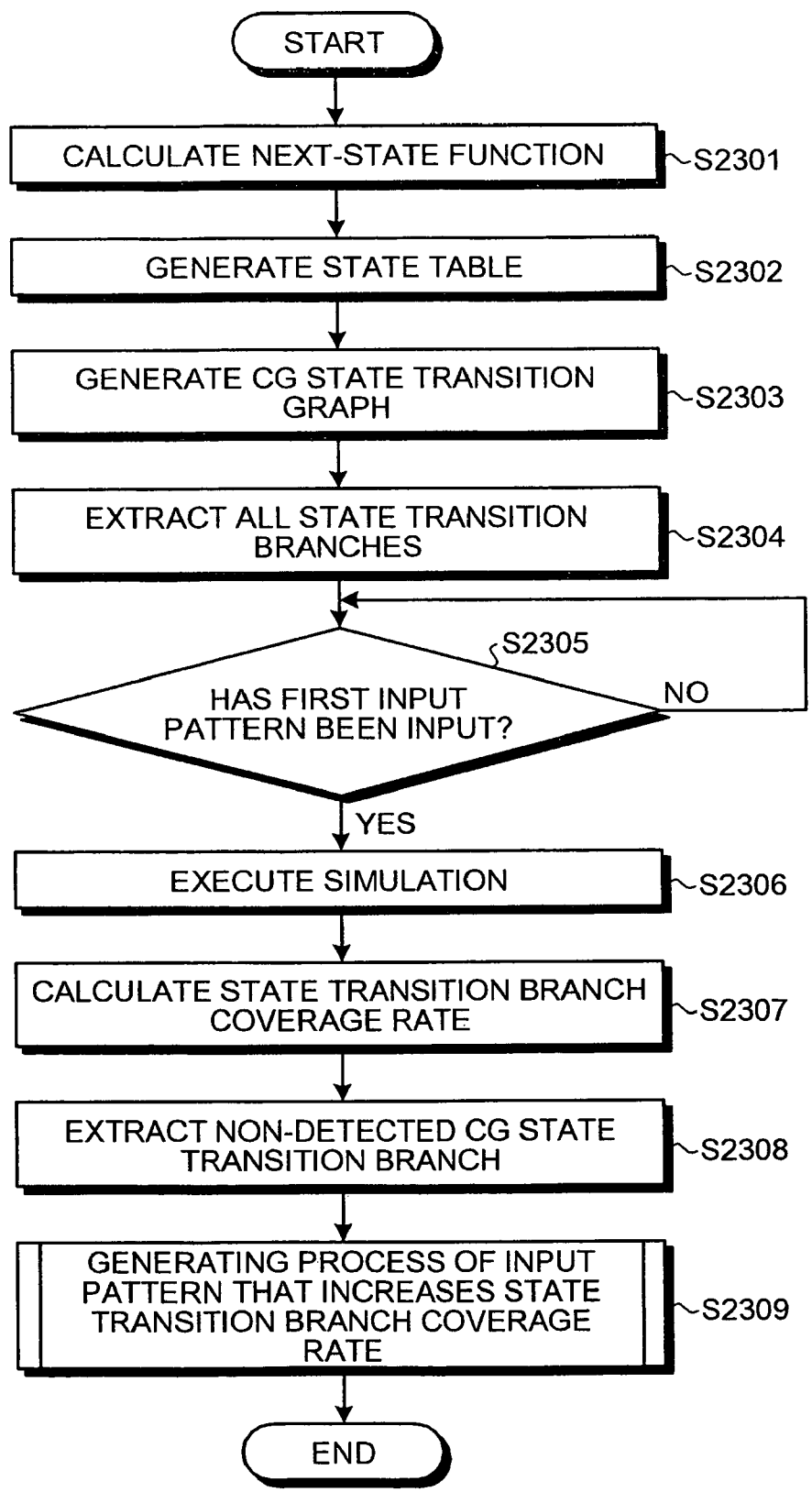
FIG. 23 is a flowchart of a third clock gating analyzing process of the clock gating analyzing apparatus.

A third clock gating analyzing process is a process for the third configuration shown in FIG. 18. FIG. 23 is a flowchart of the third clock gating analyzing process of the clock gating analyzing apparatus 100.

First, the next-state function calculating unit 801 calculates the next-state function (step S2301), and the state table generating unit 802 generates the state table T2 (step S2302). The CG-state-transition-graph generating unit 1801 generates the CG state transition graph G2 (step S2303). The CG-all-state-transition-branch output unit 1802 extracts and outputs all of the state transition branches of the clock gating state from the CG state transition graph G2 as a CG all-state transition branch group E (step S2304).

The input of the first input pattern P1 is then waited for (step S2305: NO), and if the first input pattern P1 has been input (step S2305: YES), the simulation executing unit 701 executes a circuit simulation (step S2406).

The state-transition-branch-coverage-rate calculating unit 1803 calculates the state transition branch coverage rate RE (step S2307), and branches other than the detected CG state transition branches 1810 are extracted, from the state transition branch group E, as the non-detected CG state transition branch 1820 (step S2308). A process is then executed to generate an input pattern that increases the CG all-state transition branch coverage rate RE (step S2309).

Figure 24:
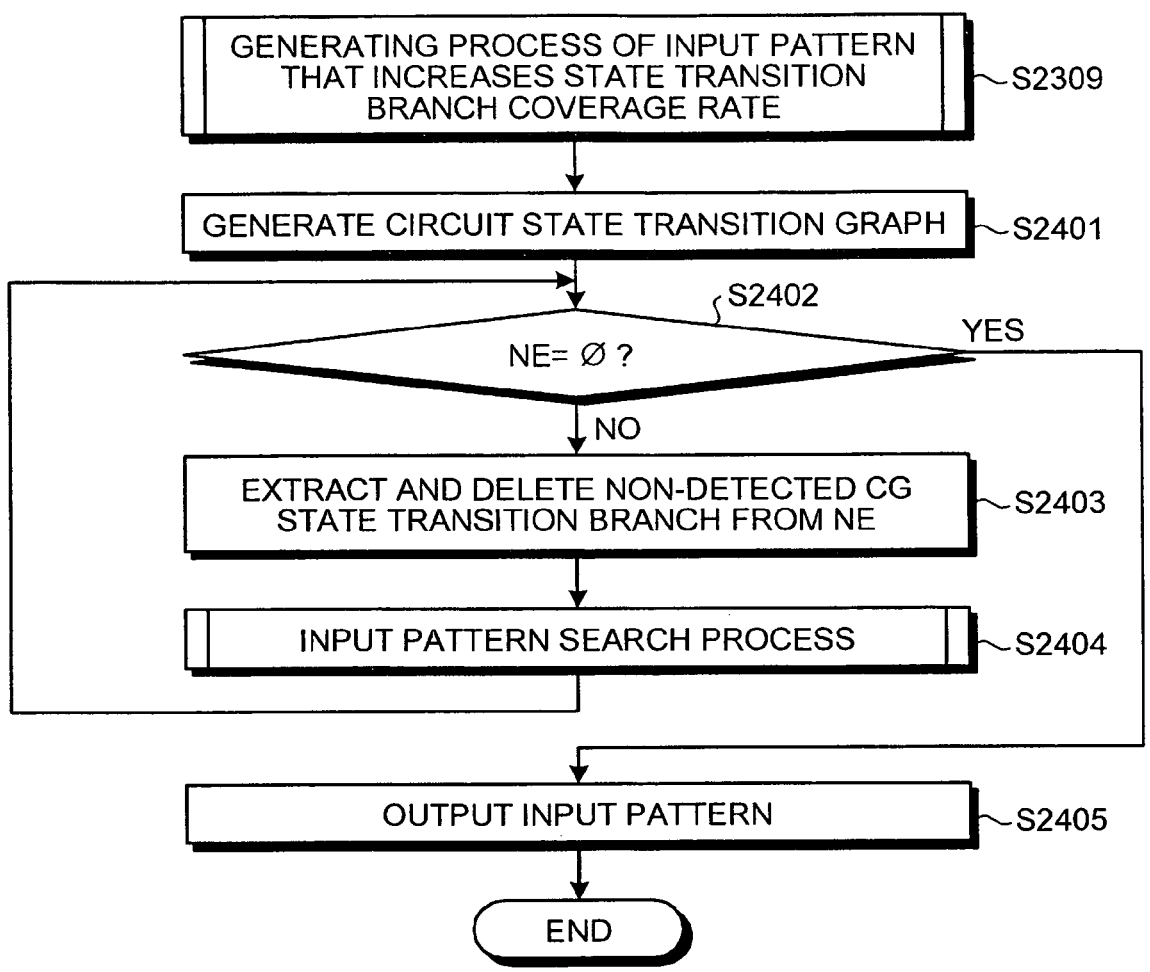
FIG. 24 is a flowchart of a process of generating an input pattern that increases the state transition branch coverage rate RE at step S2309.

FIG. 24 is a flowchart of a process of generating an input pattern that increases the state transition branch coverage rate RE at step S2309. First, the circuit-state-transition-graph generating unit 803 generates the circuit state transition graph G1 (step S2401), and it is determined whether NE=Ø (empty set) (step S2402).

The NE is a group of the non-detected CG state transition branches 1820. If not NE=Ø (step S2402: NO), the arbitrary non-detected CG state transition branches 1820 are extracted and deleted from the NE (step S2403). The searching unit 2001 executes an input pattern search process (step S2404). The details of the input pattern search process are described hereinafter.

The process returns to step S2402. If NE=Ø at step S2402 (step S2402: YES), the output unit 2002 outputs the search result as the input pattern (the third input pattern P3) that increases the state transition branch coverage rate RE (step S2405).

Figure 25:
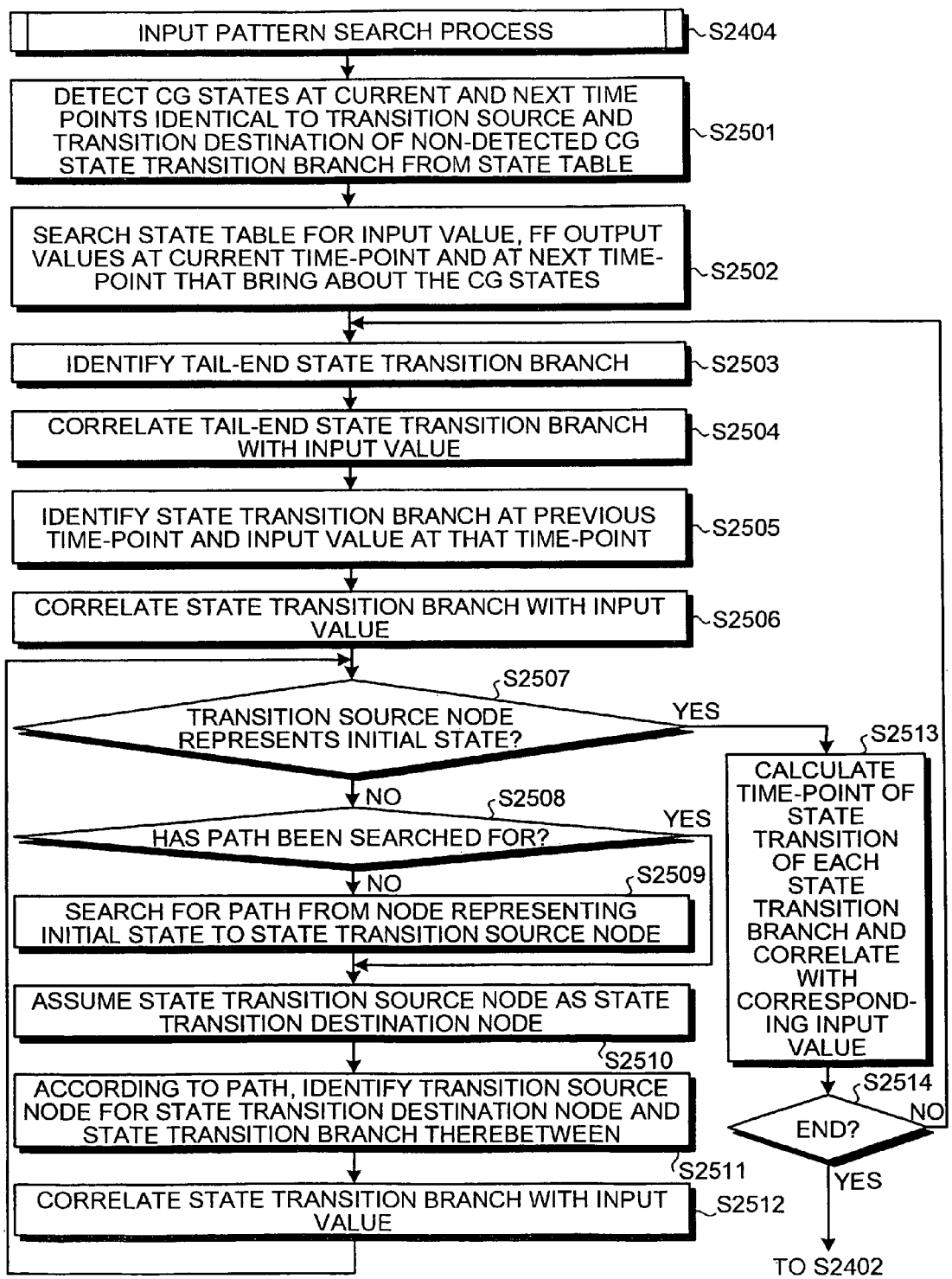
FIG. 25 is a flowchart of an input pattern search process shown at step S2404.

FIG. 25 is a flowchart of the input pattern search process shown at step S2404. First, the CG states at the current and next time-points coinciding with the transition source and destination of the non-detected CG state transition branch 1820 are detected from the state table T2 (step S2501).

The state table T2 is searched for the value of the input x1 that generates the detected CG state, the values of the FF output {y1, y2, y3} at the current time-point, and the values of the FF output {z1, z2, z3} at the next time-point (step S2502).

From the circuit state transition graph G1, the tail-end state transition branch is identified, which has the values of the FF output {y1, y2, y3} at the current time-point as the transition source node and the values of the FF output {z1, z2, z3} at the next time-point as the transition source node (step S2503).

The value of the input x1 at the time of generation of the identified tail-end state transition branch is read from the state table T2 and is correlated with the tail-end state transition branch (step S2504). A state transition branch one time-point before the tail-end state transition branch and the value of the input x1 at that time-point are identified (step S2505). The state transition branch is correlated with the value of the input x1 at that time-point (step S2506).

It is determined whether the state transition source node identified by the state transition branch is a node representing the initial state (step S2507). If the node does not represent the initial state (step S2507: NO), it is determined whether a path (from the node representing the initial state to the state transition source node) has already been searched for (step S2608).

If the path has already been searched for (step S2508: YES), the process proceeds to step S2510. On the other hand, if the path has not already been searched for (step S2508: NO), the path (from the node representing the initial state to the state transition source node) is searched for (step S2509).

The transition source node is assumed as the transition destination node (step S2510), and a transition source node of the newly assumed transition destination node and a state transition branch therebetween are identified according to the path (step S2511). The value of the input x1 at the time of generation of the state transition due to this state transition branch is then read from the state table T2 and correlated with the state transition branch (step S2512). The process returns to step S2507.

At step S2507, if the state transition source node is a node representing the initial state at step S2507 (step S2507: YES), the time-points of the state transitions of the acquired state transition branches are calculated based on the initial state (t=0) and are correlated with the values of the input x1 corresponding with the state transition branches (step S2513).

It is determined whether to terminate the process (step S2514). Specifically, for example, if another value is included in the FF output {z1, z2, z3} at the next time-point identified at step S2502, the process is not terminated (step S2514: NO) and returns to step S2503, and if no other value is included in the FF output {z1, z2, z3} at the next time-point identified at step S2502, the process returns to step S2402 shown in FIG. 24.

According to the third functional configuration and the third clock gating analyzing process of the clock gating analyzing apparatus 100, verification oversights of a clock gate function bug causing a function bug in the circuit 200 can be reduced by obtaining the state transition branch coverage rate RE and increasing the state transition branch coverage rate RE at the time of function verification of the circuit 200 by simulation.

The state transition branch coverage rate RE can automatically be increased by generating the third input pattern P3 that causes the CG state(s) not covered (non-detected CG state transition branch 1820) to emerge, thereby enabling verification oversights of a clock gate function bug causing a function in the circuit 200 to be prevented.

According to a fourth configuration, the CG all-state group S generated by the first configuration shown in FIG. 4 is used to verify a possibility of recovery from the inactive state to the active state of the local clock LCi. That is, verification is performed by taking advantage of the nature of the circuit in that the local clock LCi will eventually be recovered to the active state if the local clock LCi becomes the inactive state (state of stopping the clock) once. The same reference numerals refer to the same constituent elements as those shown in FIGS. 4, 8, and 18, and description thereof is omitted.

Figure 26:
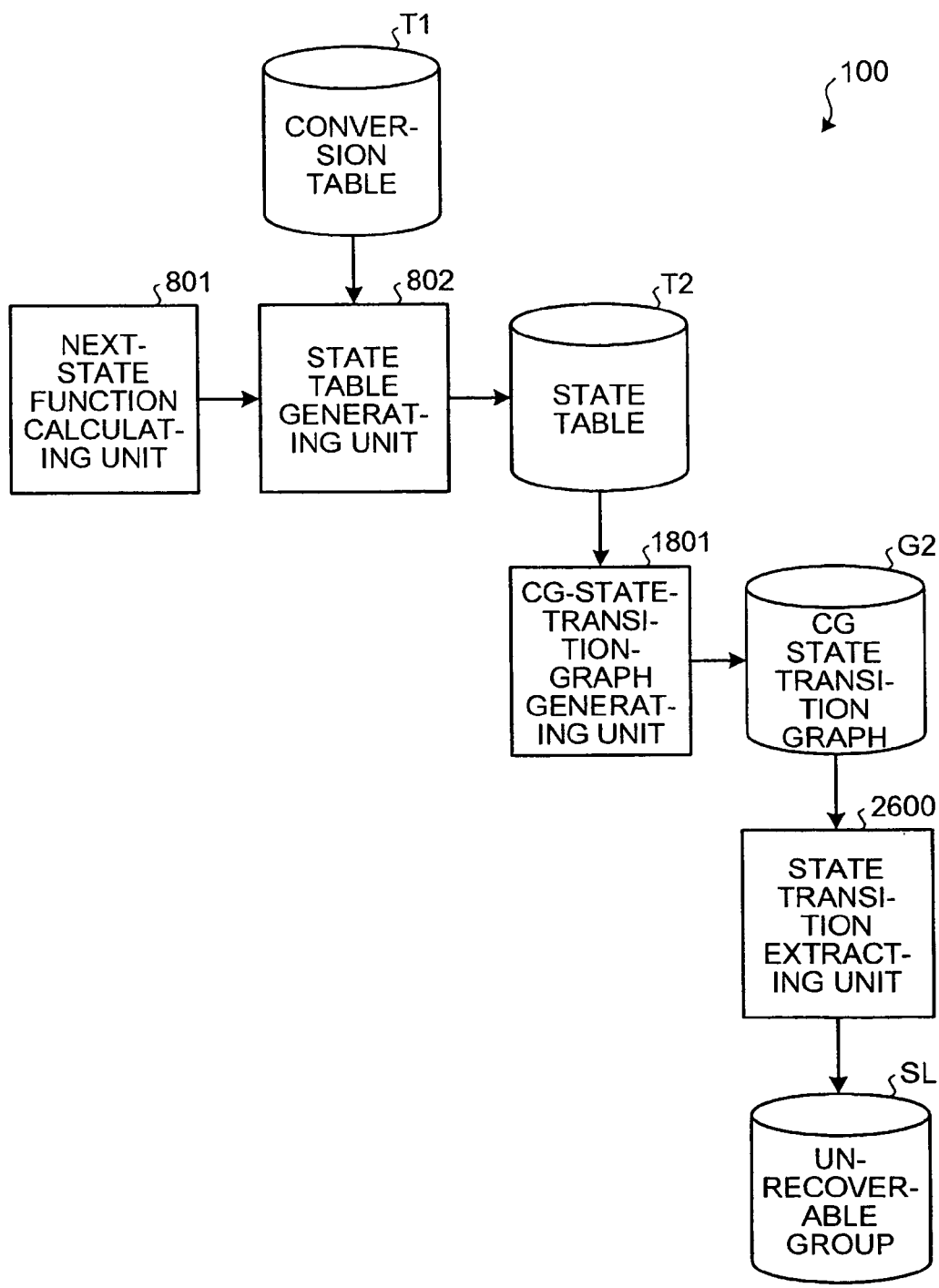
FIG. 26 is a functional diagram of a fourth configuration of the clock gating analyzing apparatus.

FIG. 26 is a functional diagram of the fourth configuration of the clock gating analyzing apparatus 100. The clock gating analyzing apparatus 100 of the fourth configuration is includes the next-state function calculating unit 801, the state table generating unit 802, the CG-state-transition-graph generating unit 1801, and a state transition extracting unit 2600. The functions of the units 801, 802, 1801, and 2600 can be realized by executing, by the CPU, relevant programs stored in the memory.

The output data from the units 801, 802, 1801, and 2600 are stored in the memory. Functional constituent elements at the destinations of connections indicated by arrows shown in FIG. 26 read, from the memory, the output data from functional constituent elements at the sources of connections and the CPU executes the programs related to the functions.

The state transition extracting unit 2600 extracts, from the CG state transition graph G2 created by the CG-state-transition-graph generating unit 1801, a state transition having the local clock LCi that has not recovered from the inactive state to the active state.

Specifically, it is determined whether the state transitions in the CG state transition graph include a state transition having a local clock LCi that is recovered from the inactive state (LCi=0) to the active state (LCi=1). That is, it is determined whether a state transition from LCi=0 to LCi=1 exists on the CG state transition graph. The local clock LCi determined to be unrecoverable is extracted as an unrecoverable state transition.

For example, in FIG. 19, with regard to the local clock LC1, for example, although the node M1 has the local clock LC1=0, since state transitions exist to the nodes M2 to M4 which have LC1=1, a state transition can be performed that enables recovery from 0 to 1. Therefore, the local clock LC1 is a recoverable local clock.

Figure 27:
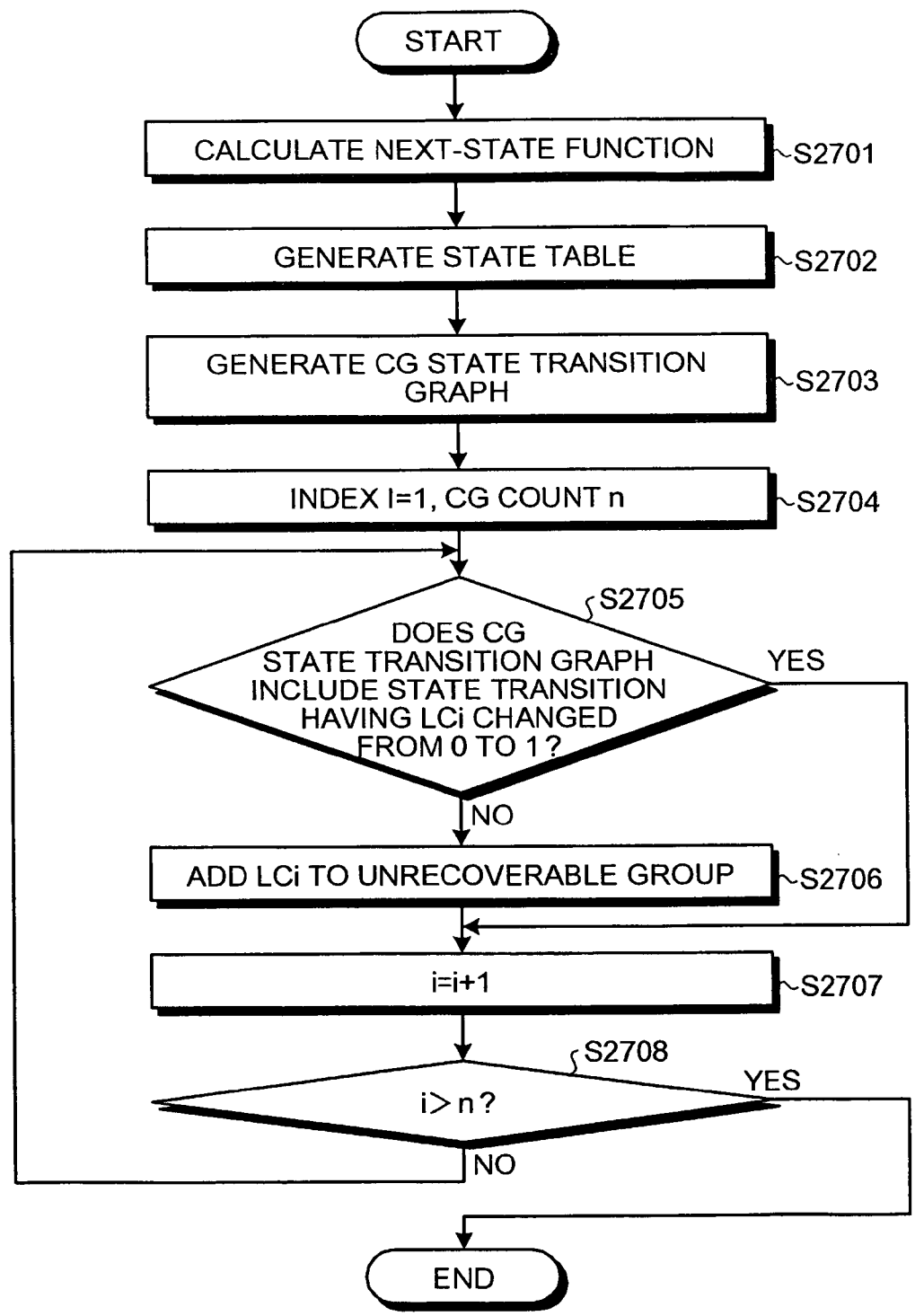
FIG. 27 is a flowchart of a fourth clock gating analyzing process of the clock gating analyzing apparatus.

A fourth clock gating analyzing process is a process for the fourth configuration shown in FIG. 26. FIG. 27 is a flowchart of the fourth clock gating analyzing process of the clock gating analyzing apparatus 100.

First, the next-state function calculating unit 801 calculates the next-state function (step S2701), and the state table generating unit 802 generates the state table T2 (step S2702). The CG-state-transition-graph generating unit 1801 generates the CG state transition graph G2 (step S2703).

The index i is set to i=1 and the clock gate count is set to n (step S2704). It is then determined whether the CG state transition graph G2 includes a state transition in which the local clock LCi has changed from 0 to 1 (step S2705).

For a local clock LCI, if there is no state transition in which the local clock LCi has changed from 0 to 1 (step S2705: NO), the local clock LCi is added to a unrecoverable group SL (step S2706). On the other hand, if there is a state transition in which the local clock LCi has changed from 0 to 1 (step S2705: YES), the process proceeds to step S2707.

At step S2707, the index i is incremented by one (step S2707) and it is determined whether i>n is satisfied (step S2708). If i>n is not satisfied (step S2708: NO), the process proceeds to step S2705. On the other hand, if i>n is satisfied (step S2708: YES), a series of processes is terminated.

According to the fourth configuration and the fourth clock gating analyzing process, reach-ability analysis of the CG state transition graph G2 can be performed to automatically verify the presence of error, in which the inactive state of the local clock LCi cannot be recovered to the active state. This enables bugs of a particular clock gate function to be completely detected without oversight.

According to a fifth configuration, the CG all-state group S generated by the first configuration shown in FIG. 4 is used to generate an error-state candidate of the clock gate CGi.

The error-state is a state when the active state (state of supplying the clock) exists even though the local clock LCi may be turned to the inactive state (state of stopping the clock). In other words, this is a state of supplying the local clock LCi to the FFs of the FF group Ai even though the supply is not required, i.e., a state of failing to perform the clock gating. The same reference numerals refer to the same constituent elements as those shown in FIGS. 4, 8, and 18, and description thereof is omitted.

Figure 28:
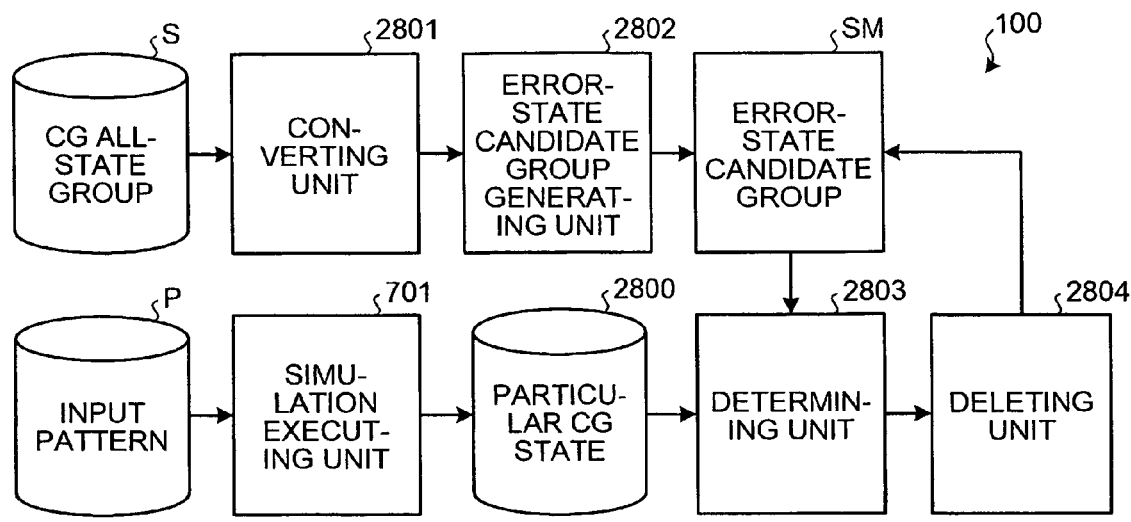
FIG. 28 is a functional diagram of a fifth configuration of the clock gating analyzing apparatus.

FIG. 28 is a functional diagram of the fifth configuration of the clock gating analyzing apparatus 100. The clock gating analyzing apparatus 100 according the fifth configuration includes the simulation executing unit 701, a converting unit 2801, an error-state candidate group generating unit 2802, a determining unit 2803, and a deleting unit 2804. The function of the units 701 and 2801 to 2804 can be realized by executing, by the CPU, relevant programs stored in the memory.

The output data from the units 701 and 2801 to 2804 are stored in the memory. Functional constituent elements at the destinations of connections indicated by arrows shown in FIG. 28, read from the memory, the output data from functional constituent elements at the sources of connections and the CPU executes programs related to the functions.

The converting unit 2801 converts an arbitrary CG state in the CG all-state group S into a CG state having the clock gate CGi changed from the active state to the inactive state. The error-state candidate group generating unit 2802 generates, based on the converted CG state, an error-state candidate mi related to the local clock LCi.

Figure 29:
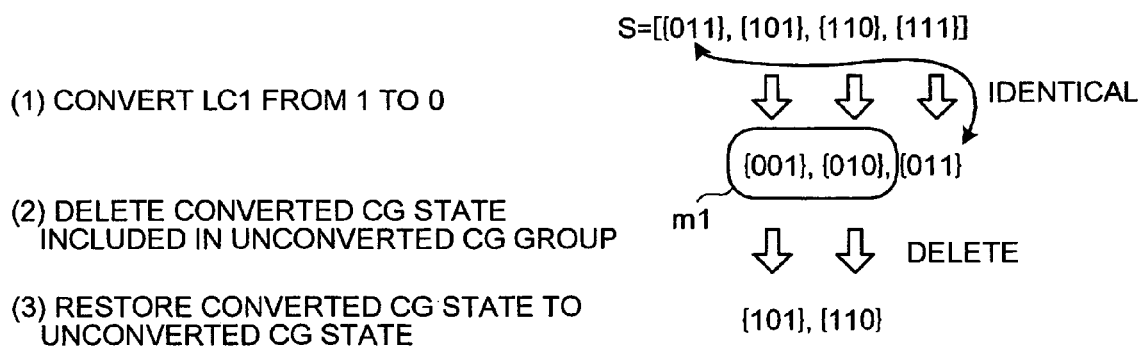
FIG. 29 is a schematic of an example of generation of the error-state candidate.

An example of generation of the error-state candidate by the converting unit 2801 and the error-state candidate group generating unit 2802 is described. FIG. 29 is a schematic of an example of generation of the error-state candidate by the converting unit 2801 and the error-state candidate group generating unit 2802. FIG. 29 shows an example of generation of an error-state candidate m1 in the case of i=1, i.e., when the local clock LCi is LC1.

(1) First, the CG states having the local clock LC1=1 are obtained from among the CG states in the CG all-state group S, and the value of LC1 is converted from 1 to 0, resulting in conversion from {101} to {001}, from {110} to {010}, and from {111} to {011}. (2) The converted CG state identical to the unconverted CG state is deleted. Since {011} after the conversion is also included in the original CG all-state group S and is not in the error-state, {011} is deleted. (3) Finally, the remaining CG states after (2) are restored to the CG state before the conversion. As a result, {001} is restored to {101}, and {010} is restored to {110}.

The remaining CG states {101} and {110} after the conversion are generated as the error-state candidates m1. Such a process is executed for the local clocks LC1 to LCn to generate an error-state candidate group SM. The error-state candidate mi is an element within the error-state candidate group SM and is an element having the CG state not included in the CG all-state group S when the state of LCi is changed from 1 to 0. This enables generation of the CG state that cannot accept a state of not performing the clock gating of the FFs as the CG state of the circuit 200.

The determining unit 2803 determines whether the error-state candidate mi in the error-state candidate group SM is identical to the CG state acquired from the simulation result of the simulation executing unit 701 (hereinafter, a "particular CG state 2800"). It is also determined from the simulation result whether values of the FFs in the FF group Ai of the local clock LCi are changed at the time of the particular CG state 2800.

The deleting unit 2804 deletes the particular CG state 2800 from among the error-state candidates mi. Specifically, if the error-state candidate mi is identical to the particular CG state 2800 and the values of the FFs in the FF group Ai of the local clock LCi are changed, the clock gate CGi is in the active state. Therefore, such a particular CG state 2800 is deleted from the error-state candidates mi. This can narrow down the error-state candidates mi.

Figure 30:
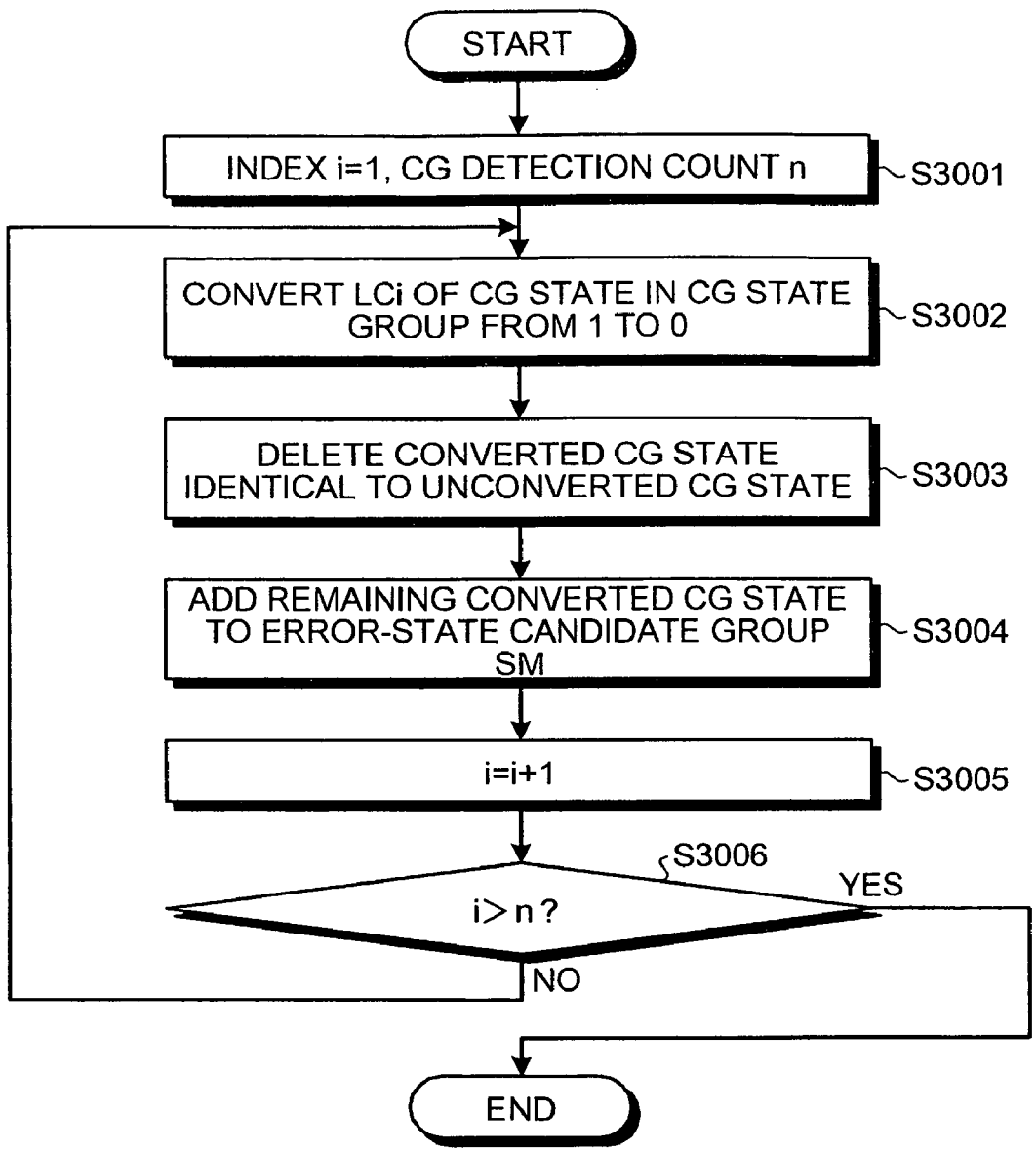
FIG. 30 is a flowchart of a fifth clock gating analyzing process of the clock gating analyzing apparatus.

A fifth clock gating analyzing process is a process for the fifth configuration shown in FIG. 28. FIG. 30 is a flowchart of the fifth clock gating analyzing process of the clock gating analyzing apparatus.

The index i is set to i=1 and the CG detection count is set to n (step S3001). The converting unit 2801 converts the local clock LCi of the CG states in the CG all-state group S from 1 to 0 (step S3002). The converted CG states identical to the unconverted CG states are deleted (step S3003). The remaining converted CG states are restored to the CG state before the conversion to generate the error-state candidates mi, which are added to the error-state candidate group SM (step S3004).

The index i is incremented by one (step S3005) and it is determined whether i>n is satisfied (step S3006). If i>n is not satisfied (step S3006: NO), the process returns to step S3002. If i>n is satisfied (step S3006: YES), a series of processes are terminated. This enables the simple conversion process to solely and automatically generate the error-state candidates mi.

Figure 31:
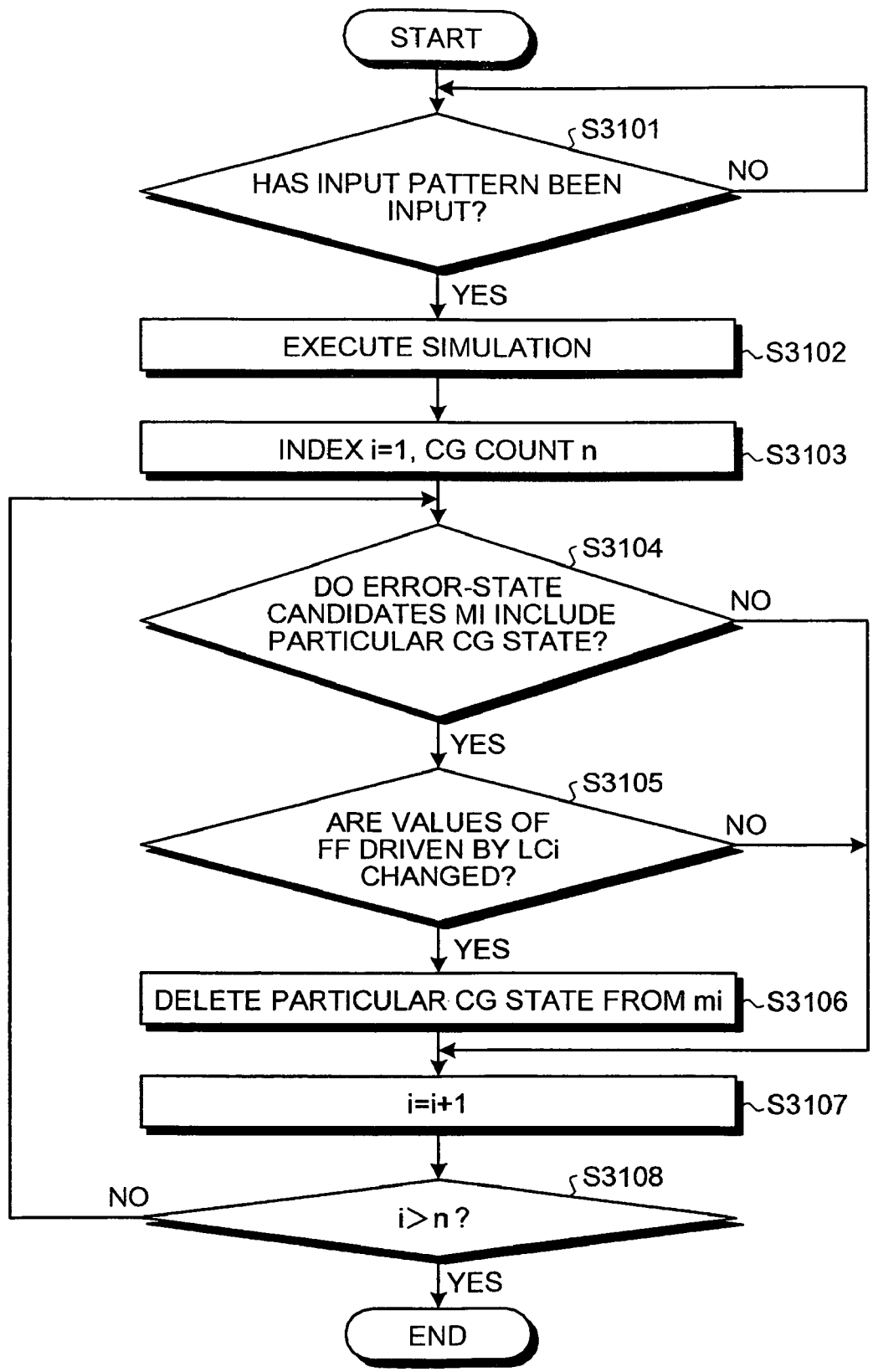
FIG. 31 is a flowchart of a process for narrowing down error-state candidates.

FIG. 31 is a flowchart of a process for narrowing down the error-state candidates mi. First, the input of the input pattern P is waited for (step S3101: NO), and when the input pattern P is input (step S3101: YES), the simulation executing unit 701 executes a circuit simulation (step S3102). As a result, the particular CG state 2800 is obtained.

The index i is set to i=1 (step S3103), and the determining unit 2803 determines whether the error-state candidates mi include the particular CG state 2800 (step S3104). If the particular CG state 2800 is not included (step S3104: NO), the process proceeds to step S3107.

If the particular CG state 2800 is included (step S3104: YES), it is determined whether values of the FFs driven by the local clock LCi, i.e., FFs in the FF group Ai are changed by the particular CG state 2800 (step S3105). If the values of the FFs are not changed (step S3105: NO), the process proceeds to step S3107. If the values of the FFs are changed (step S3105: YES), the particular CG state 2800 is deleted from among the error-state candidate mi (step S3106).

At step S3107, i is incremented by one (step S3107) and it is determined whether i>n is satisfied (step S3108). If i>n is not satisfied (step S3108: NO), the process returns to step S3104. On the other hand, if i>n is satisfied (step S3108: YES), a series of processes are terminated. As a result, the error-state candidates mi can effectively be narrowed down from the simulation result.

According to the fifth configuration and the fifth clock gating analyzing process of the clock gating analyzing apparatus 100, the error-state candidate mi can be obtained which fails to perform the clock gating for the CG state that cannot be accepted as the CG state of the circuit 200.

If the values of the FFs in the FF group of the local clock LCi are not changed by a particular CG clock gating state from the simulation result, the particular CG state 2800 can be left among the error-state candidates mi as a candidate of improper the clock gating (state of not stopping the clock even though the clock can be stopped). Therefore, improper clock gating, which causes increased power consumption of the circuit 200, can be reduced.

As described above, the clock gating analyzing apparatus, the clock gating analyzing method, and the clock gating analyzing program can alleviate the design burden of designers, improve credibility of a circuit subject to analysis, and achieve low power consumption.

The clock gating analyzing method described in the present embodiment can be implemented using a computer, such as personal computer and a work station, to execute a program that is prepared in advance. The program is recorded on a computer-readable medium such as a hard disk, flexible disk, compact disk read-only memory (CD-ROM), magneto optical disk (MO), and digital versatile disk (DVD) and is read from the recording medium by the computer for execution. The program may be a transmission medium distributable through a network such as the Internet.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An non-transitory computer-readable recording medium storing therein a clock gating analyzing program that causes a computer to execute:
   detecting a plurality of clock gates that supply a clock or terminate the clock to a plurality of sequential circuit elements in a target circuit;
   calculating, for each of the clock gates, a clock gate function indicating activation of a local clock output from a local clock detected at the detecting;
   generating a conversion table by a substitution of a plurality of combinations of output values from the sequential circuit elements into each of the clock gate functions to calculate a plurality of combinations of clock gate function values, each combination of clock gate function values being a clock gating state that indicates an activation state of each of the local clocks collectively, wherein the conversion table indicates a conversion of the combination of output values to the clock gating state; and
   outputting a clock-gating-all-state group covering all the clock gating states possible in the target circuit based on the conversion table;
   wherein the local clock is supplied even when the clock gate function is in an inactive state.

2. The non-transitory computer-readable recording medium according to claim 1, wherein the computer program further causes the computer to execute calculating a state coverage rate indicating a coverage rate of the clock-gating-all-state group by the clock gating states detected from a simulation result of a simulation involving an input of an arbitrary input pattern to the target circuit.

3. The non-transitory computer-readable recording medium according to claim 1, wherein the computer program further causes the computer to execute:

extracting, from the clock-gating-all-state group, a non-detected clock gating state that excludes the clock gating states detected from a simulation result of a simulation involving an input of an arbitrary input pattern to the target circuit; and generating, using the conversion table, an input pattern that causes a non-clock-gating state, extracted at the extracting the non-detected clock gating state, to emerge.

4. The non-transitory computer-readable recording medium according to claim 3, wherein the generating the input pattern includes:

calculating a next-state function that indicates an output change from a current time-point to a next time-point related to the sequential circuit elements;

generating, based on the conversion table and the next-state function, a state table that correlates the combinations of output values at the current time-point and the clock gating states corresponding to the combinations of output values at the current time-point with combinations of output values at the next time-point and the clock gating states corresponding to the combinations of output values at the next time-point;

generating, based on combinations of the output values at the current time-point and the next time-point in the state table, a circuit-state-transition graph indicating a plurality of state transitions of the target circuit;

searching the circuit-state-transition graph for a state transition to an initial state from the combination of the output values at the next time-point corresponding to the non-detected clock gating state, wherein the non-detected clock gating state is defined as the clock gating state at the next time-point; and outputting a search result, obtained at the searching the circuit-state-transition graph, as an input pattern that causes the non-clock-gating state, extracted at the extracting the non-detected clock gating, to emerge.

5. The non-transitory computer-readable recording medium according to claim 1, wherein the computer program further causes the computer to execute:

calculating a next-state function that indicates an output change from a current time-point to a next time-point related to the sequential circuit elements;

generating, based on the conversion table and the next-state function, a state table that correlates the combinations of output values at the current time-point and the clock gating states corresponding to the combinations at the current time-point with combinations of output values at the next time-point and the clock gating states corresponding to the combinations at the next time-point;

generating, based on the clock-gating-all-state group and the state table, a clock-gating-state-transition graph indicating a plurality of state transitions of the clock gating states; and outputting a clock-gating-all-state-transition-branch group by extracting all the clock gating state transition branches of the clock gating states from the clock-gating-state-transition graph.

6. The non-transitory computer-readable recording medium according to claim 1, wherein the computer program further causes the computer to execute:

calculating a next-state function that indicates an output change from a current time-point to a next time-point related to the sequential circuit element;

generating, based on the conversion table and the next-state function, a state table that correlates the combinations of output values at the current time-point and the clock gating states corresponding to the combinations of output values at the current time-point with combinations of output values at the next time-point and the clock gating states corresponding to the combinations of output values at the next time-point;

generating, based on the clock-gating-all-state group and the state table, a clock-gating-state-transition graph indicating a plurality of state transitions of the clock gating states; and extracting a state transition in which the clock gate does not recover from an inactive state to an active state from the clock-gating-state-transition graph.

7. The non-transitory computer-readable recording medium according to claim 1, wherein the computer program further causes the computer to execute:

converting a plurality of arbitrary clock gating states in the clock-gating-all-state group into a clock gating state that includes an arbitrary local clock changed from an active state to an inactive state; and generating a clock gating error-state candidate by deleting, from the clock gating states converted at the converting the arbitrary clock gating states, a clock gating state identical to the clock gating state in the clock-gating-all-state group.

8. The non-transitory computer-readable recording medium according to claim 7, wherein the computer program further causes the computer to execute:

determining whether the clock gating error-state candidates include a particular clock gating state detected from a simulation result of a simulation involving an input of an arbitrary input pattern into the target circuit;

determining whether an output value is changed in a sequential circuit element driven by the clock gate that corresponds to the arbitrary clock gating state subjected to conversion at the converting the arbitrary clock gating states; and deleting, based on a determination result obtained at the determining whether the output value of the sequential circuit element changes, the particular clock gating state from the clock gating error-state candidates.

9. A clock gating analyzing apparatus controlled by a processor comprising:

a detecting unit, a computer making the detecting unit detect a plurality of clock gates that supply a clock or terminate the clock to a plurality of sequential circuit elements in a target circuit by executing a program;

a clock-gate-function-calculating unit, the computer making the clock-gate-function-calculating unit calculate, for each of the clock gates, a clock gate function indicating activation of a local clock output from a local clock detected by the detecting unit by executing the program;

a conversion table generating unit, the computer making the conversion table generating unit generate a conversion table by a substitution of a plurality of combinations of output values from the sequential circuit elements into each of the clock gate functions to calculate a plurality of combinations of clock gate function values by executing the program, each combination of clock gate function values being a clock gating state that indicates an activation state of each of the local clocks collectively, wherein the conversion table indicates a conversion of the combination of output values to the clock gating state; and a clock-gating-all-state-group outputting unit, the computer making the clock-gating-all-state-group outputting unit output a clock-gating-all-state group covering all the clock gating states possible in the target circuit based on the conversion table by executing the program; wherein the local clock is supplied even when the clock gate function is in an inactive state.

10. The clock gating analyzing apparatus according to claim 9 further comprising a state-coverage-rate-calculating unit, the computer making the state-coverage-rate-calculating unit calculate a state coverage rate indicating a coverage rate of the clock-gating-all-state group by the clock gating states detected from a simulation result of a simulation involving an input of an arbitrary input pattern to the target circuit, by executing the program.

11. The clock gating analyzing apparatus according to claim 9 further comprising:
   a non-detected-clock-gating-state extracting unit, the computer making the non-detected-clock-gating-state extracting unit extract, from the clock-gating-all-state group, a non-detected clock gating state that excludes the clock gating states detected from a simulation result of a simulation involving an input of an arbitrary input pattern to the target circuit, by executing the program; and
   an input pattern generating unit, the computer making the input pattern generating unit generate, using the conversion table, an input pattern that causes a non-clock-gating state, extracted by the non-detected-clock-gating-state extracting unit, to emerge, by executing the program.

12. The clock gating analyzing apparatus according to claim 11, wherein the generating the input pattern generating unit includes:
   a next-state function calculating unit , the computer making the next-state function calculating unit calculate a next-state function that indicates an output change from a current time-point to a next time-point related to the sequential circuit elements, by executing the program;
   a state table generating unit, the computer making the state table generating unit generate, based on the conversion table and the next-state function, a state table that correlates the combinations of output values at the current time-point and the clock gating states corresponding to the combinations of output values at the current time-point with combinations of output values at the next time-point and the clock gating states corresponding to the combinations of output values at the next time-point, by executing the program;
   a circuit-state-transition-graph generating unit, the computer making the circuit-state-transition-graph generating unit generate, based on combinations of the output values at the current time-point and the next time-point in the state table, a circuit-state-transition graph indicating a plurality of state transitions of the target circuit, by executing the program;
   a searching unit, the computer making the searching unit search the circuit-state-transition graph for a state transition to an initial state from the combination of the output values at the next time-point corresponding to the non-detected clock gating state, wherein the non-detected clock gating state is defined as the clock gating state at the next time-point, by executing the program; and
   an outputting unit, the computer making the outputting unit output a search result, obtained by the searching unit, as an input pattern that causes the non-clock-gating state, extracted by the non-detected-clock-gating-state extracting unit, to emerge, by executing the program.

13. The clock gating analyzing apparatus according to claim 9 further comprising:
   a next-state function calculating unit, the computer making the next-state function calculating unit calculate a next-state function that indicates an output change from a current time-point to a next time-point related to the sequential circuit elements, by executing the program;
   a state table generating unit, the computer making the state table generating unit generate, based on the conversion table and the next-state function, a state table that correlates the combinations of output values at the current time-point and the clock gating states corresponding to the combinations at the current time-point with combinations of output values at the next time-point and the clock gating states corresponding to the combinations at the next time-point, by executing the program;
   a clock-gating-state-transition-graph generating unit, the computer making the clock-gating-state-transition-graph generating unit generate, based on the clock-gating-all-state group and the state table, a clock-gating-state-transition graph indicating a plurality of state transitions of the clock gating states, by executing the program; and
   a clock-gating-all-state-transition-branch-group outputting unit, the computer making the clock-gating-all-state-transition-branch group output a clock-gating-all-state-transition-branch group by extracting all the clock gating state transition branches of the clock gating states from the clock-gating-state-transition graph, by executing the program.

14. The clock gating analyzing apparatus according to claim 9 further comprising:
   a next-state function calculating unit, the computer making the next-state function calculating unit calculate a next-state function that indicates an output change from a current time-point to a next time-point related to the sequential circuit element, by executing the program;
   a state table generating unit, the computer making the state table generating unit generate, base on the conversion table and the next-state function, a state table that correlates the combinations of output values at the current time-point and the clock gating states corresponding to the combinations of output values at the current time-point with combinations of output values at the next time-point and the clock gating states corresponding to the combinations of output values at the next time-point, by executing the program;
   a clock-gating-state-transition-graph generating unit, the computer making the clock-gating-state-transition-graph generate , based on the clock-gating-all-state group and the state table, a clock-gating-state-transition graph indicating a plurality of state transitions of the clock gating states, by executing the program; and
   an extracting unit, the computer making the extracting unit extract a state transition in which the clock gate does not recover from an inactive state to an active state from the clock-gating-state-transition graph, by executing the program.

15. The clock gating analyzing apparatus according to claim 9 further comprising:
   a converting unit, the computer making the converting unit convert a plurality of arbitrary clock gating states in the clock-gating-all-state group into a clock gating state that includes an arbitrary local clock changed from an active state to an inactive state, by executing the program; and
   a clock-gating-error-state-candidate generating unit, the clock-gating-error-state-candidate generating unit generating a clock gating error-state candidate by deleting, from the clock gating states converted by the converting unit, a clock gating state identical to the clock gating state in the clock-gating-all-state group, by executing the program.

16. The clock gating analyzing apparatus according to claim 15 further comprising:
a determining unit, the computer making the determining unit determine whether the clock gating error-state candidates include a particular clock gating state detected from a simulation result of a simulation involving an input of an arbitrary input pattern into the target circuit, and whether an output value is changed in a sequential circuit element driven by the clock gate that corresponds to the arbitrary clock gating state subjected to conversion by the converting unit, by executing the program; and
a deleting unit, the computer making the deleting unit delete, based on a determination result obtained by the determining unit, the particular clock gating state from the clock gating error-state candidates, by executing the program.

17. A clock gating analyzing method comprising:
detecting a plurality of clock gates that supply a clock or terminate the clock to a plurality of sequential circuit elements in a target circuit;
calculating, for each of the clock gates, a clock gate function indicating activation of a local clock output from a local clock detected at the detecting;
generating a conversion table by a substitution of a plurality of combinations of output values from the sequential circuit elements into each of the clock gate functions to calculate a plurality of combinations of clock gate function values, each combination of clock gate function values being a clock gating state that indicates an activation state of each of the local clocks collectively, wherein the conversion table indicates a conversion of the combination of output values to the clock gating state; and
outputting a clock-gating-all-state group covering all the clock gating states possible in the target circuit based on the conversion table;
wherein the local clock is supplied even when the clock gate function is in an inactive state.

18. The clock gating analyzing method according to claim 17 further comprising calculating a state coverage rate indicating a coverage rate of the clock-gating-all-state group by the clock gating states detected from a simulation result of a simulation involving an input of an arbitrary input pattern to the target circuit.

19. The clock gating analyzing method according to claim 17 further comprising:
extracting, from the clock-gating-all-state group, a non-detected clock gating state that excludes the clock gating states detected from a simulation result of a simulation involving an input of an arbitrary input pattern to the target circuit; and
generating, using the conversion table, an input pattern that causes a non-clock-gating state, extracted at the extracting the non-detected clock gating state, to emerge.

20. The clock gating analyzing method according to claim 19, wherein the generating the input pattern includes:
calculating a next-state function that indicates an output change from a current time-point to a next time-point related to the sequential circuit elements;
generating, based on the conversion table and the next-state function, a state table that correlates the combinations of output values at the current time-point and the clock gating states corresponding to the combinations of output values at the current time-point with combinations of output values at the next time-point and the clock gating states corresponding to the combinations of output values at the next time-point;
generating, based on combinations of the output values at the current time-point and the next time-point in the state table, a circuit-state-transition graph indicating a plurality of state transitions of the target circuit;
searching the circuit-state-transition graph for a state transition to an initial state from the combination of the output values at the next time-point corresponding to the non-detected clock gating state, wherein the non-detected clock gating state is defined as the clock gating state at the next time-point; and
outputting a search result, obtained at the searching the circuit-state-transition graph, as an input pattern that causes the non-clock-gating state, extracted at the extracting the non-detected clock gating, to emerge.

21. The clock gating analyzing method according to claim 17 further comprising:
calculating a next-state function that indicates an output change from a current time-point to a next time-point related to the sequential circuit elements;
generating, based on the conversion table and the next-state function, a state table that correlates the combinations of output values at the current time-point and the clock gating states corresponding to the combinations at the current time-point with combinations of output values at the next time-point and the clock gating states corresponding to the combinations at the next time-point;
generating, based on the clock-gating-all-state group and the state table, a clock-gating-state-transition graph indicating a plurality of state transitions of the clock gating states; and
outputting a clock-gating-all-state-transition-branch group by extracting all the clock gating state transition branches of the clock gating states from the clock-gating-state-transition graph.

22. The clock gating analyzing method according to claim 17 further comprising:
calculating a next-state function that indicates an output change from a current time-point to a next time-point related to the sequential circuit element;
generating, based on the conversion table and the next-state function, a state table that correlates the combinations of output values at the current time-point and the clock gating states corresponding to the combinations of output values at the current time-point with combinations of output values at the next time-point and the clock gating states corresponding to the combinations of output values at the next time-point;
generating, based on the clock-gating-all-state group and the state table, a clock-gating-state-transition graph indicating a plurality of state transitions of the clock gating states; and
extracting a state transition in which the clock gate does not recover from an inactive state to an active state from the clock-gating-state-transition graph.

23. The clock gating analyzing method according to claim 17 further comprising:
converting a plurality of arbitrary clock gating states in the clock-gating-all-state group into a clock gating state that includes an arbitrary local clock changed from an active state to an inactive state; and generating a clock gating error-state candidate by deleting, from the clock gating states converted at the converting the arbitrary clock gating states, a clock gating state identical to the clock gating state in the clock-gating-all-state group.

24. The clock gating analyzing method according to claim 23 further comprising:

determining whether the clock gating error-state candidates include a particular clock gating state detected from a simulation result of a simulation involving an input of an arbitrary input pattern into the target circuit;

determining whether an output value is changed in a sequential circuit element driven by the clock gate that corresponds to the arbitrary clock gating state subjected to conversion at the converting the arbitrary clock gating states; and deleting, based on a determination result obtained at the determining whether the output value of the sequential circuit element changes, the particular clock gating state from the clock gating error-state candidates.

* * * * *

UNITED STATES PATENT AND TRADEMARK OFFICE
CERTIFICATE OF CORRECTION

| | | |
|---|---|---|
| PATENT NO. | : 8,069,026 B2 | Page 1 of 1 |
| APPLICATION NO. | : 12/002349 | |
| DATED | : November 29, 2011 | |
| INVENTOR(S) | : Higuchi | |

It is certified that error appears in the above-identified patent and that said Letters Patent is hereby corrected as shown below:

In the Claims

Col. 24, line 39   Delete "base on the" and insert --based on the-- in its place.
Claim 14

Signed and Sealed this
Seventeenth Day of July, 2012

David J. Kappos
*Director of the United States Patent and Trademark Office*